US008791783B2

(12) United States Patent
Miyazaki et al.

(10) Patent No.: US 8,791,783 B2
(45) Date of Patent: Jul. 29, 2014

(54) ELECTRONIC COMPONENT TO BE EMBEDDED IN SUBSTRATE AND COMPONENT-EMBEDDED SUBSTRATE

(75) Inventors: Masashi Miyazaki, Takasaki (JP); Yuichi Sugiyama, Takasaki (JP); Yoshiki Hamada, Takasaki (JP); Yutaka Hata, Takasaki (JP); Hideki Yokota, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/642,469

(22) PCT Filed: May 11, 2011

(86) PCT No.: PCT/JP2011/060814
§ 371 (c)(1),
(2), (4) Date: Nov. 19, 2012

(87) PCT Pub. No.: WO2011/145490
PCT Pub. Date: Nov. 24, 2011

(65) Prior Publication Data
US 2013/0200977 A1 Aug. 8, 2013

(30) Foreign Application Priority Data

May 17, 2010 (JP) ................................ 2010-113037

(51) Int. Cl.
*H01F 27/29* (2006.01)
*H01F 5/00* (2006.01)
*H01L 27/08* (2006.01)

(52) U.S. Cl.
USPC ............................ 336/192; 336/200; 257/231

(58) Field of Classification Search
CPC .......... H01F 17/0013; H01F 2017/002; H01F 5/003; H01F 17/0006; H01F 41/041; H01L 2924/2517; H01L 23/49822; H01L 23/645; H01L 28/10; H01L 7/427; H01L 2001/0092; H03H 2001/0085
USPC ......... 336/192, 199, 200, 205, 206, 207, 208, 336/232

See application file for complete search history.

(56) References Cited

U.S. PATENT DOCUMENTS 5,170,302 A * 12/1992 Matsumoto .............. 360/123.39
5,529,831 A * 6/1996 Waga et al. .................. 428/209
(Continued)

FOREIGN PATENT DOCUMENTS

JP 2000-261271 A 9/2000
JP 3540733 B 7/2004
(Continued)

OTHER PUBLICATIONS

An Office Action issued by the Korean Patent Office, mailed Aug. 9, 2013, for Korean counterpart application No. 10-2012-7022470.
(Continued)

*Primary Examiner* — Alexander Talpalatski
*Assistant Examiner* — Joselito Baisa
(74) *Attorney, Agent, or Firm* — Law Office of Katsuhiro Arai

(57) ABSTRACT

An electronic component to be embedded in a substrate is configured so that planar coils protected by insulators are sandwiched be a pair of magnetic layers. Ports, or openings or absent parts are provided at predetermined positions of one or both of the magnetic layers, and the predetermined positions correspond to the positions opposite to terminal electrodes of the planar coils. Accordingly, a contribution to reduction of the size and weight of electronic equipment can be made.

9 Claims, 20 Drawing Sheets

(56) References Cited

U.S. PATENT DOCUMENTS

| | | | |
|---|---|---|---|
| 6,504,466 B1 * | 1/2003 | Katsurada | 336/200 |
| 6,587,025 B2 * | 7/2003 | Smith et al. | 336/200 |
| 6,850,127 B2 * | 2/2005 | Sakakura et al. | 333/25 |

FOREIGN PATENT DOCUMENTS

| | | | |
|---|---|---|---|
| JP | 2006-344631 | A1 | 12/2006 |
| JP | 2007-066973 | A1 | 3/2007 |
| JP | 4112914 | B | 7/2008 |
| TW | 200723319 | A | 6/2007 |
| TW | 200816885 | A | 4/2008 |

OTHER PUBLICATIONS

A Notification of Reasons for Refusal issued by the Japanese Patent Office, mailed Nov. 28, 2013, for Japanese counterpart application No. 2012-515826.
A Notification of Examination Opinions with Search Report issued by Taiwan Intellectual Property Office, mailed Feb. 27, 2014, for Taiwan counterpart application No. 100116557.

* cited by examiner (a)

Approx. 2.5 mm

Approx. 2.0 mm (b)

Approx. 1.5 mm

Approx. 150 μm (a)

(b)

(c)

(d)

(a)

(b)

(c)

(d)

(a)

(b)

(c)

ELECTRONIC COMPONENT TO BE EMBEDDED IN SUBSTRATE AND COMPONENT-EMBEDDED SUBSTRATE

This application is the U.S. National Phase under 35 U.S.C. §371 of International Application PCT/JP2011/060814, filed May 11, 2011, which claims priority to Japanese Patent Application No. 2010-113037, filed May 17, 2010. The International Application was published under PCT Article 21(2) in a language other than English.

TECHNICAL FIELD

The present invention relates to an electronic component to be embedded in substrate and a component-embedded substrate, and more specifically to an inductor element to be embedded in substrate and a component-embedded substrate in which such inductor element is embedded.

PRIOR ART

Various electronic devices are becoming increasingly smaller and lighter in recent years. This is primarily due to the development of micro-size electronic components and progress of mounting technologies, particularly to the technological progress in the area of the so-called "component-embedded substrate" which is a printed circuit board or other electronic substrate in which specific electronic components are embedded. In particular, substrates with electronic components completely buried within the thickness of the substrate contribute significantly to the size reduction and weight reduction of electronic devices through flattening of the front side and back side of the substrate.

Electronic components buried in component-embedded substrates are sometimes called "electronic components to be embedded in a substrate." Representative forms of electronic components to be embedded in substrate include IC chips and other semiconductor integrated circuits, resistive elements and capacitive elements. Today, ultra-thin component-embedded substrates in practical use have these electronic components to be embedded in substrate, or namely semiconductor integrated circuits, resistive elements and capacitive elements, completely buried in the substrate.

It should be noted that the above examples (examples of electronic components to be embedded in substrate) do not include "inductor elements," which are also called "coil elements." This is because they are thicker than semiconductor integrated circuits; resistive elements and capacitive elements and therefore substrates in which they are buried cannot be made thinner, or burying an inductor element in a thin substrate would cause a part of the inductor element to project from the front side or back side of the substrate.

FIG. 20 is a structural diagram of a conventional inductor element. As shown in the figure, an inductor element 1 has a main laminate 4 having coil patterns 2, 3 formed inside, and terminal electrodes 5, 6 formed on both ends of this main laminate 4, with the terminal electrodes 5, 6 and coil patterns 2, 3 electrically connected to each other.

Such component shape is typical of an electronic component manufactured for mounting on the surface of a printed board by means of soldering alone, or so-called "surface-mount component." In other words, a printed board refers to a substrate having wiring for electronic components and when electronic components are to be mounted on this printed board, the conventional practice has been to make holes in the substrate, guide pins through the holes, and solder the guided pins to install the components. With the development of surface-mount components, electronic components can now be easily mounted on the surface of printed boards via direct soldering. Since there is no need to make holes in the printed board, lead wires for soldering are no longer necessary and pins can be positioned at much smaller pitches, which supports size reduction and density increase.

Resistive elements and capacitive elements used as electronic components to be embedded in substrate also have an exterior structure similar to this inductor element structure, meaning that they are also shaped like surface-mfount components, but these elements are thinner than inductor elements and therefore even when buried in substrates, they do not increase the substrate thickness or present other problems. On the other hand, inductor elements that are thicker than resistive elements, etc., do not allow substrates to be made thinner if inductor elements are shaped like conventional surface-mount components, and some measures are required. (Refer to symbol H in (c) in FIG. 20.)

Against this backdrop, Patent Literature 1 specified below describes a technology to build a coil into a substrate, while Patent Literature 2 specified below describes a planar inductor technology that contributes to thickness reduction.

PRIOR ART LITERATURES

Patent Literatures

Patent Literature 1: Japanese Patent No. 4112914
Patent Literature 2: Japanese Patent No. 3540733

SUMMARY OF THE INVENTION

Problems to Be Solved by the Invention

However, the technology described in Patent Literature 1 involves building coils into a printed circuit board, and it is not a technology to bury a completed electronic component, such as an inductor element, within a substrate. Accordingly, even if the coil height can be reduced to help make the substrate thinner, the finished coil quality will directly determine the substrate yield, which is not ideal in terms of cost.

On the other hand, the technology described in Patent Literature 2 is not accompanied by any information on the electrode structure, and since it is therefore natural to assume that the conventional electrode structure (refer to FIG. 20) is used, the aforementioned inconvenience, or specifically the problem of thick structure and not being able to reduce the thickness of the substrate, cannot be resolved.

Accordingly, the present invention provides a thickness-reduced electronic component to be embedded in substrate and a component-embedded substrate.

Means for Solving the Problems

The invention based on a first aspect is an electronic component to be embedded in substrate, comprising: a pair of magnetic layers; a planar coil placed between the pair of magnetic layers; multiple insulator layers placed between the pair of magnetic layers in a manner sandwiching both faces of the planar coil; a terminal electrode provided at least on one end of the planar coil; and a hole, opening, or absent part provided in the magnetic layer at a location corresponding to the position of the one terminal electrode.

The invention based on a second aspect is an electronic component to be embedded in substrate according to the first viewpoint, wherein the magnetic layer has a rectangular plane and the one terminal electrode on the planar coil is formed at a position corresponding to a corner of the magnetic layer.

The invention based on a third aspect is an electronic component to be embedded in substrate according to the first viewpoint, wherein the terminal electrode is formed on both ends of the planar coil and also at one or more desired positions between both ends of the planar coil.

The invention based on a fourth aspect is an electronic component to be embedded in substrate according to the first viewpoint, wherein the hole, opening, or absent part in the magnetic layer has an opening area roughly equivalent to or smaller than the size of the terminal electrode on the planar coil.

The invention based on a fifth aspect is an electronic component to be embedded in substrate according to the first viewpoint, wherein a hole or opening is provided at a corresponding position in the insulator layer so that the terminal electrode can be led out through the hole, opening, or absent part.

The invention based on a sixth aspect is an electronic component to be embedded in substrate according to the first viewpoint, wherein the planar coil comprises a first planar coil and a second planar coil where the first planar coil and second planar coil are connected to each other in series, and the one terminal electrode on the first planar coil and the one terminal electrode on the second planar coil are each placed at a position corresponding to a different corner on one side of the insulator layer which has a rectangular shape.

The invention based on a seventh aspect is an electronic component to be embedded in substrate according to the sixth viewpoint, wherein of the terminal electrodes, one terminal electrode is placed at a position corresponding to a corner of the insulator layer, while the other terminal electrode is placed at a position corresponding to the center side of the insulator layer.

The invention based on an eighth aspect is an electronic component to be embedded in substrate according to the seventh viewpoint, wherein the series connection of the first planar coil and second planar coil is made by connecting the terminal electrodes placed at positions corresponding to the center sides of the first planar coil and second planar coil via a front-back through electrode provided in the insulator layer between them.

The invention based on a ninth aspect is an electronic component to be embedded in substrate according to the sixth or seventh viewpoint, wherein the one terminal electrode on the first planar coil and the one terminal electrode on the second planar coil are placed in corners on one side of the insulator layer corresponding to left and right positions on different planes.

The invention based on a tenth aspect is an electronic component to be embedded in substrate according to the sixth viewpoint, wherein, for the one terminal electrode on the first planar coil and one terminal electrode on the second planar coil, a terminal electrode not connected to either planar coil is provided, respectively, in a different corner corresponding to one side of the insulator layer, and the one terminal electrode on the first planar coil is connected to the non-connected terminal electrode provided on the second planar coil side via a front-back through electrode provided in the insulator layer, while the one terminal electrode on the second planar coil is connected to the non-connected terminal electrode provided on the first planar coil side via a front-back through electrode provided in the insulator layer.

The invention based on an eleventh aspect is a component-embedded substrate produced by burying the electronic component to be embedded in substrate according to the first viewpoint, while forming a hole or opening in the insulator layer via the hole, opening, or absent part in the electronic component to be embedded in substrate, after which conductive material is formed and then the terminal electrodes of the electronic component to be embedded in substrate are electrically connected to the electrodes provided on the substrate side via the conductive material.

Effects of the Invention

According to the present invention, a thickness-reduced electronic component to be embedded in substrate and a component-embedded substrate can be provided, to contribute to size reduction and weight reduction of electronic devices.

MODES FOR CARRYING OUT THE INVENTION

Figure 1:
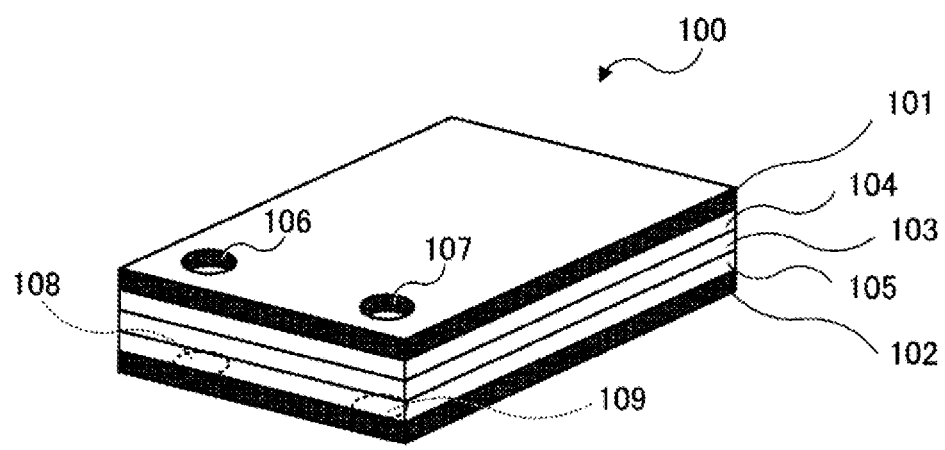
FIG. 1 illustrates an exterior view of an electronic component to be embedded in substrate pertaining to an embodiment.

The following explains embodiments of the present invention by referring to the drawings.

<Electronic Component to be Embedded in Substrate>

FIG. 1 is an exterior perspective view of an electronic component to be embedded in substrate pertaining to an embodiment. This electronic component to be embedded in substrate 100 is an inductor element comprising a pair of magnetic layers 101, 102 facing each other at a specified interval in between, in which three insulation resin layers, or specifically a middle insulation resin layer 103, a top insulation resin layer 104, and a bottom insulation resin layer 105 are sandwiched, and planar coils explained later are formed on the top and bottom insulation resin layers 104, 105. The configuration is such that circular holes 106, 107 are provided at "specified positions" on the top magnetic layer 101 for taking out electrodes, while similar circular holes 108, 109 are also provided at "specified positions" on the bottom magnetic layer 102 for taking out electrodes. These "specified positions" are explained later.

The magnetic layers 101, 102 are each a metal soft magnetic foil such as Fe or Co soft magnetic foil of 18 μm in thickness t, while the middle insulation resin layer 103, top insulation resin layer 104, and bottom insulation resin layer 105 are each an epoxy resin-based insulation material. Alternatively, the magnetic layers 101, 102 can use a nano-granular film, ferrite plating, etc., with a thickness of less than 1 μm. Also, the middle insulation resin layer 103, top insulation resin layer 104, and bottom insulation resin layer 105 can use the same insulation material used by the component-embedded substrate, such as insulation material containing cloth and filler. Unlike the insulation material for component-embedded substrate, however, this insulation material can use an insulation resin kneaded with a filler constituted by magnetic powder, such as metal magnetic body, ferrite or other magnetic body. In this case, use of an insulation resin kneaded with magnetic powder is preferable because it enhances the characteristics of the inductor element and also makes the inductor element smaller and thinner.

Figure 2:
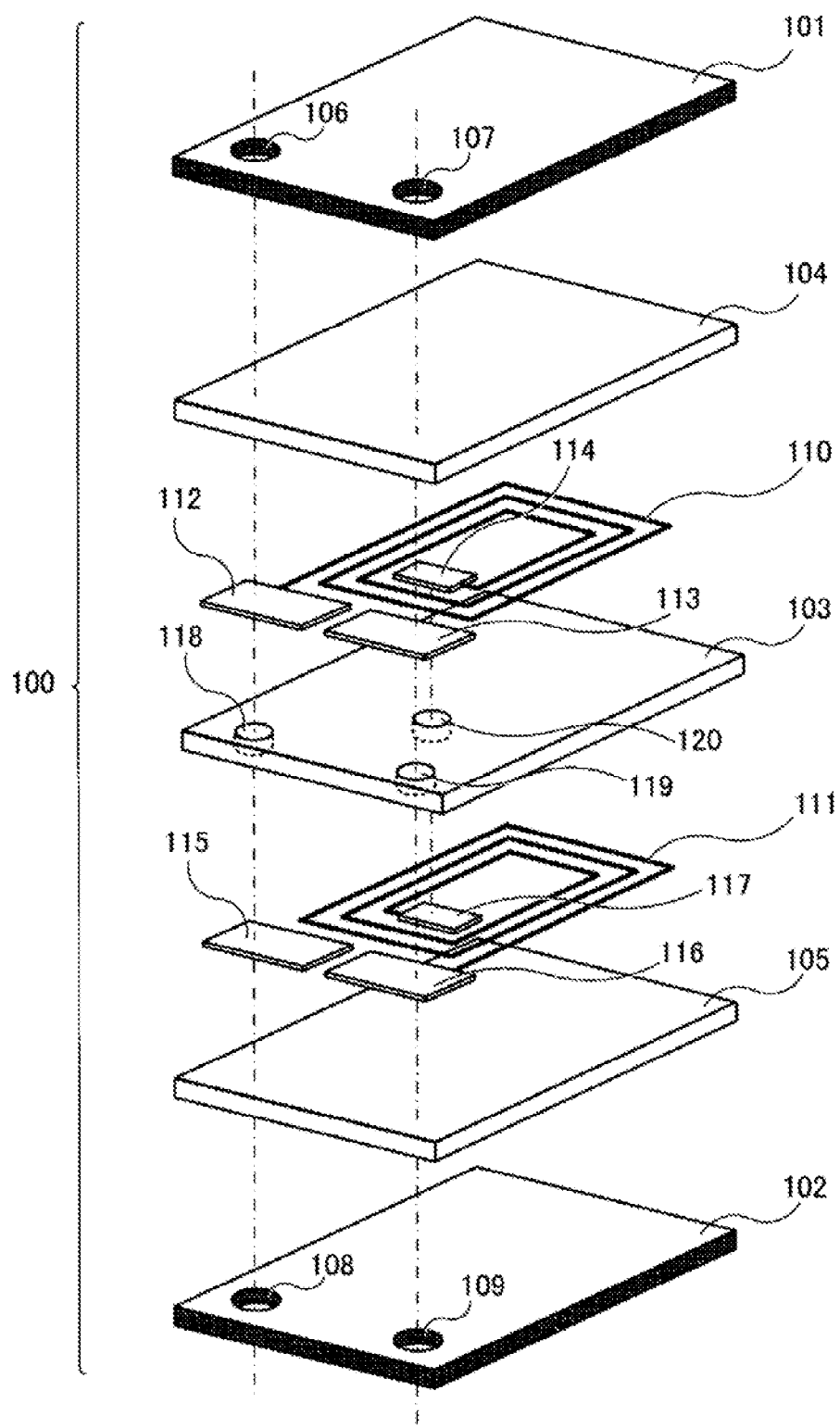
FIG. 2 illustrates an exploded perspective view showing layers of an electronic component to be embedded in substrate 100.

FIG. 2 is a perspective view showing the structure of the electronic component to be embedded in substrate 100. It is an exploded perspective view showing each layer separately, to facilitate understanding. In this figure, a first planar coil 110 formed on the top side of the middle insulation resin layer 103, and a second planar coil 111 formed on the bottom side of the middle insulation resin layer 103, have three electrodes, namely terminal electrodes 112 to 114 and terminal electrodes 115 to 117, respectively.

Of these terminal electrodes, the terminal electrodes 114 and 117 are positioned on the center sides of the respective planer coils. The terminal electrode 112 is positioned on the left side on one side of the middle insulation resin layer 103, while the terminal electrode 113 is positioned on the right side. The terminal electrode 116 is positioned on the right side on one side of the middle insulation resin layer 103, while the terminal electrode 115 is positioned on the left side. The terminal electrodes 113 and 115 are not connected to the planar coils, respectively. The terminal electrodes 112 and 115 are facing each other in the vertical direction with the middle insulation resin layer 103 between them. The terminal electrodes 113 and 116 are facing each other in the vertical direction with the middle insulation resin layer 103 between them. The terminal electrodes 114 and 117 are facing each other in the vertical direction with the middle insulation resin layer 103 between them.

The facing pairs of these terminal electrodes 112 to 117 are electrically connected to each other via three front-back through electrodes 118 to 120 formed on the middle insulation resin layer 103, respectively. To be specific, the terminal electrodes 112 and 115 are connected via the front-back through electrode 118, terminal electrodes 113 and 116 are connected via the front-back through electrode 119, and terminal electrodes 114 and 117 are connected via the front-back through electrode 120.

The illustrated terminal electrodes 112 to 117 are all relatively large in the figure, but they need to be only large enough to be able to function as terminal electrodes and preferably their area is kept to a minimum so as to increase the number of windings of the planar coils 110, 111. The terminal electrodes 113, 115 are used as relay terminal electrodes for the vertically facing lead-out terminal electrodes.

The first planar coil 110 comprises a planar coil pattern looped by a specified number of windings and two terminal electrodes 112, 114 connected on both ends of the pattern, and similarly the second planar coil 111 comprises a planar coil pattern looped by a specified number of windings and two terminal electrodes 116, 117 connected on both ends of the pattern.

As mentioned above, the terminal electrode 112 is connected to the terminal electrode 115, terminal electrode 113 is connected to the terminal electrode 116, and terminal electrode 114 is connected to the terminal electrode 117, and therefore this pair of coils, or specifically the first planar coil 110 and second planar coil 111, constitute a two-sided lead-out inductor (coil) where one lead-out terminal is the "terminal electrode 112 or terminal electrode 115," and the other lead-out terminal is the "terminal electrode 113 or terminal electrode 116."

Here, as mentioned above, the pair of planar coils 110, 111 (including the terminal electrodes 112 to 117) are formed on the top side and bottom side of the middle insulation resin layer 103, respectively, with the top insulation resin layer 104 and bottom insulation resin layer 105 sandwiched between the pair of planar coils 110, 111 (including the terminal electrodes 112 to 117) and magnetic layers 101, 102, respectively. Since the middle insulation resin layer 103, top insulation resin layer 104, and bottom insulation resin layer 105 are each an "insulator," the pair of planar coils 110, 111 (including the terminal electrodes 112 to 117) are protected by the insulators and not exposed to atmosphere (air). This provides an advantage in that the insulation resin layers 103 to 105 help prevent the terminal electrodes 112 to 117 from being oxidized.

As understood from this figure, the holes 106, 107 formed in the top magnetic layer 101 and holes 108, 109 formed in the bottom magnetic layer 102 are facing the terminal electrodes 112, 113 for leading out from both ends of the first planar coil 110, and terminal electrodes 115, 116 for leading out from both ends of the second planar coil 111, respectively. To be specific, the holes 106 and 108 are facing the terminal electrodes 112 and 115, while the holes 107 and 109 are facing the terminal electrodes 113 and 116. These facing positions are referred to as "specified positions" in this Specification.

Figure 3:
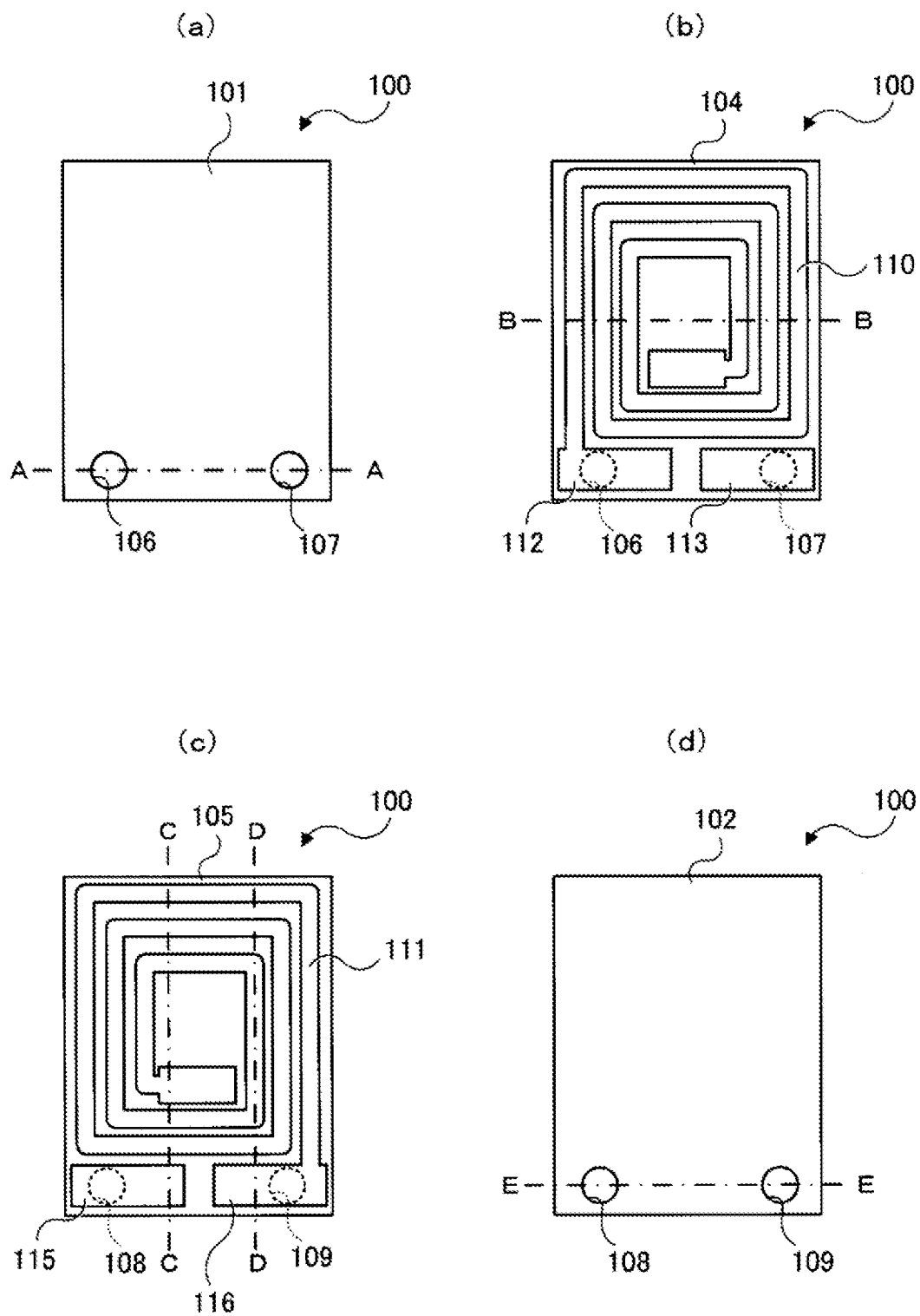
FIG. 3 illustrates plan views of a specific layer of an electronic component to be embedded in substrate 100.

FIG. 3 provides plan views of the electronic component to be embedded in substrate 100, where (a) is an overhead view of the magnetic layer 101 from above, while (b) is an overhead view of the top insulation resin layer 104 from above, which is exposed after removing the magnetic layer 101 above it. (c) is an overhead view of the bottom insulation resin layer 105 from above, which is exposed after removing the magnetic layer 101 and top and middle insulation resin layers 103, 104 above it. (d) is an overhead view of the magnetic layer 102 from above, which is exposed after removing the magnetic layer 101 and top, middle and bottom insulation resin layers 103 to 105 above it.

As understood from these figures, the electronic component to be embedded in substrate 100 in the embodiment has the rectangular electrodes 112, 113, 115, 116 formed on both ends of the two planar coils 110, 111, with the holes 106, 107, 108, 109 formed in the magnetic layers 101, 102, and these electrodes 112, 113, 115, 116 and holes 106, 107, 108, 109 face one another at specified positions, respectively.

The planar coils 110, 111 are formed with Cu plating, for example, based on an L/S of 90/30 μm, thickness t of 25 μm, 7 number of turns, and "2520 in size."

Figure 4:
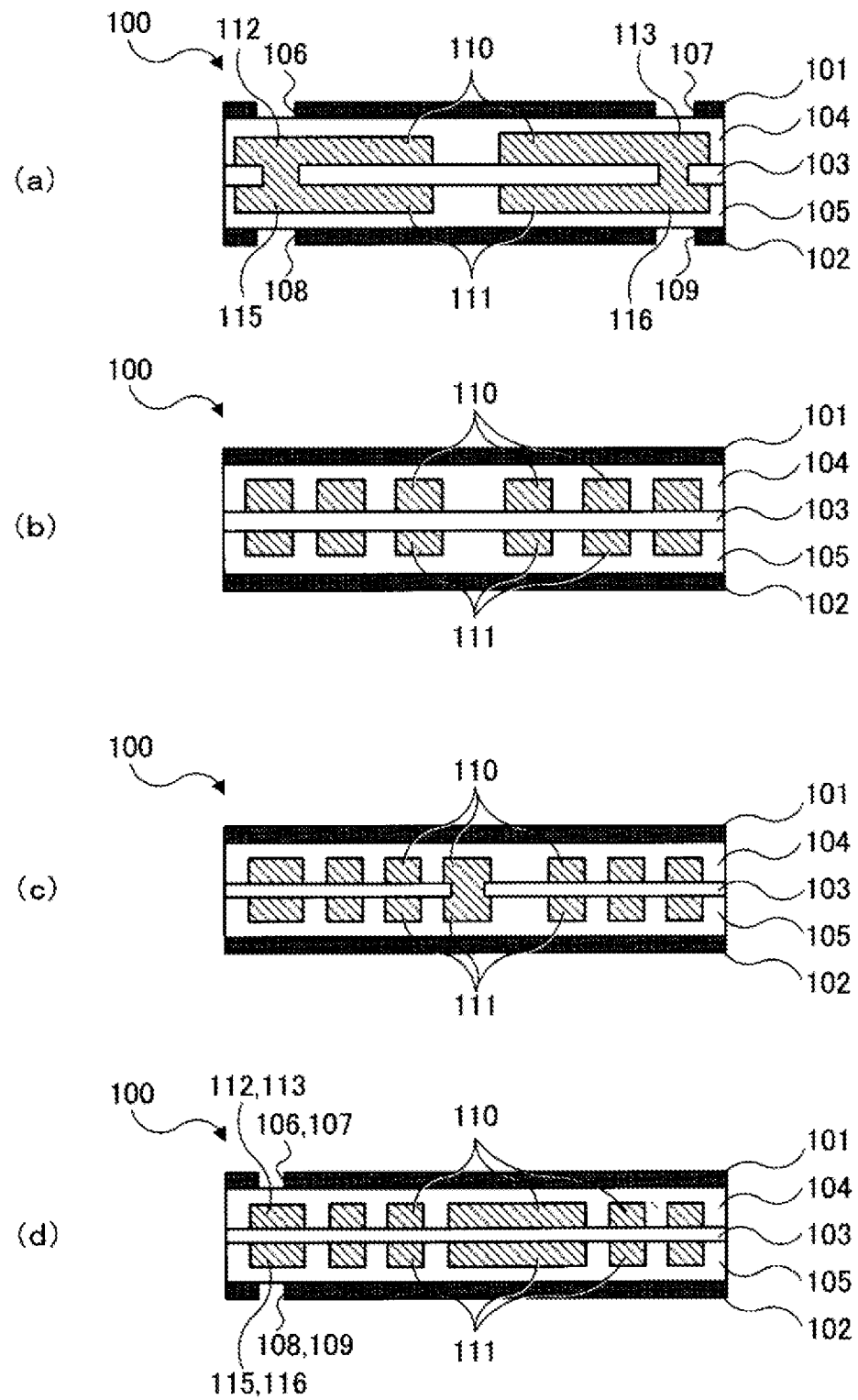
FIG. 4 illustrates section views of a specific part of an electronic component to be embedded in substrate 100.

FIG. 4 provides section views of the electronic component to be embedded in substrate 100, where (a) shows section A-A of FIG. 3, (b) shows section B-B of FIG. 3, (c) shows section C-C of FIG. 3, (d) shows section D-D of FIG. 3, and (e) shows section E-E of FIG. 3.

As shown in these figures, the electronic component to be embedded in substrate 100 in the embodiment has the holes 106, 107, 108, 109 for taking out electrodes formed in a manner facing the electrodes 112, 113, 115, 116 on the planar coils 110, 111.

Figure 20:
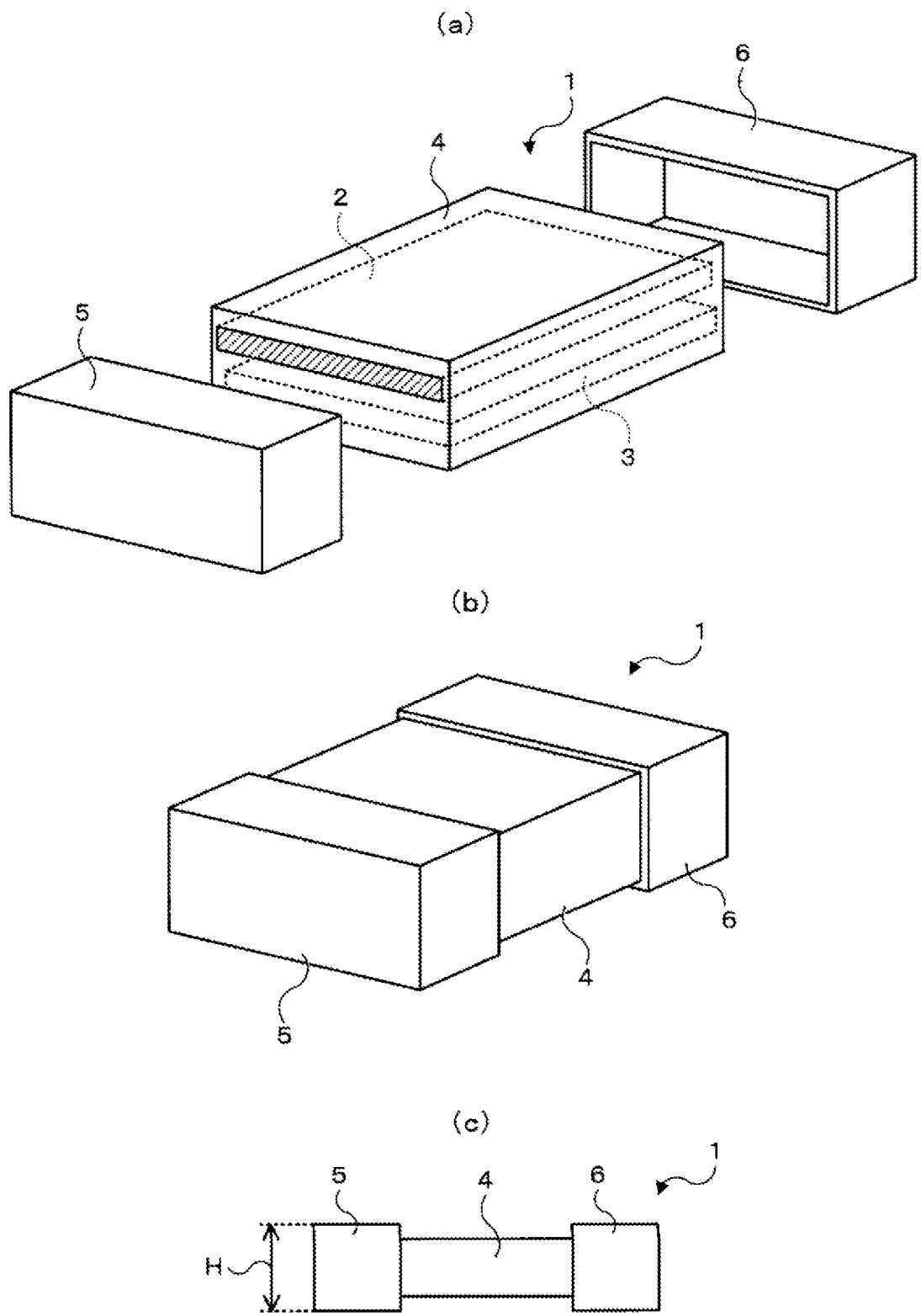
FIG. 20 illustrates perspective views showing the structure of a conventional inductor element.

Here, the electronic component to be embedded in substrate 100 in the embodiment is compared against a conventional component. When the inductor element 1 shown in FIG. 20 is used as an example of a conventional component as a matter of convenience, the electronic component to be embedded in substrate 100 in the embodiment has no parts corresponding to the terminal electrodes 5, 6 of the inductor element 1 in this example of a conventional component. This is because the holes 106, 107, 108, 109 for taking out electrodes are formed on the magnetic layers 101, 102 and therefore the terminal electrodes 5, 6 as provided conventionally are not required.

And since, as explained at the beginning, one drawback (thick structure) in the example of a conventional component is due to the thickness of these electrodes 5, 6, the electronic component to be embedded in substrate 100 in the embodiment, which does not need the electrodes 5, 6, can be naturally made thinner by the thickness of the electrodes 5, 6, which gives rise to a special effect that when such component is buried in a component-embedded substrate, the thickness of the substrate can be reduced.

Figure 5:
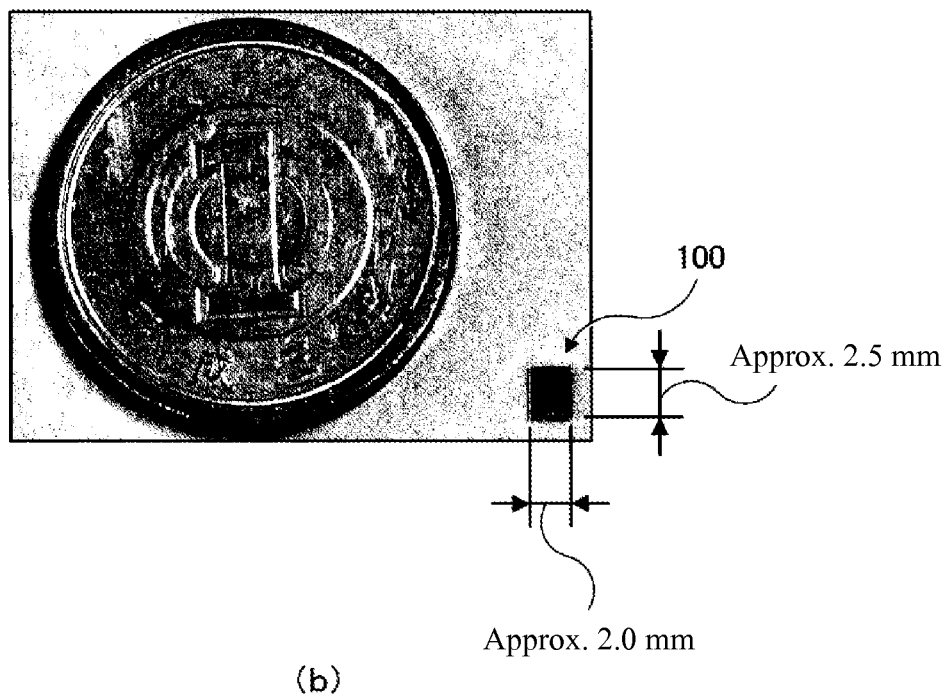
FIG. 5 illustrates drawings showing the size and thickness of an electronic component to be embedded in substrate 100 in an embodiment.
Figure 5:
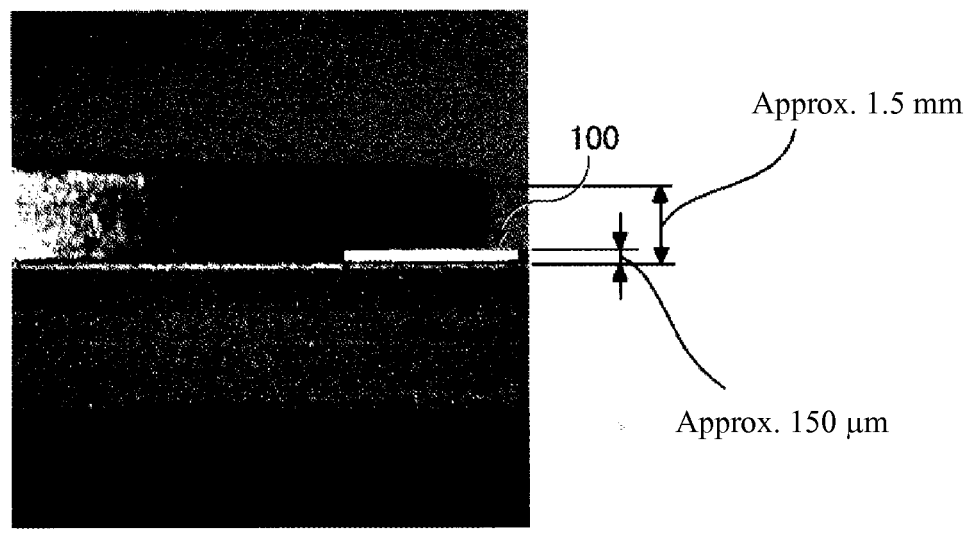

FIG. 5 provides drawings showing the size and thickness of the electronic component to be embedded in substrate 100 in the embodiment. The electronic component to be embedded in substrate 100 has a very small size corresponding to a grain of rice, such as approx. 2.5 mm×2.0 mm. Comparison is made against the Japanese one-yen coin in (a) to illustrate the specific size, while comparison is made against the thickness of the Japanese one-yen coin (approx. 1.5 mm) in (b) to illustrate the specific thickness. The thickness of the component to be embedded in substrate 100 is approx. 150 μm. As understood from these comparative examples, the electronic component to be embedded in substrate 100 in the embodiment is extremely small in both size and thickness and therefore when it is buried in a component-embedded substrate, it greatly contributes to thickness reduction of the substrate.

In addition, the holes 106, 107, 108, 109 formed at positions facing the terminal electrodes 112, 113, 115, 116 on the planar coils 110, 111 (specified positions) are provided as extremely small openings. This allows the sizes of the terminal electrodes 112, 113, 115, 116 to be kept to the required minimum, which in turn reduces the area ratios of the terminal electrodes 112, 113, 115, 116 to the planar coils 110, 111 and thereby achieves high inductance.

Also, an inductor element in which planar coils 110, 111 ensuring sufficient electric performance are formed, or specifically the electronic component to be embedded in substrate 100, is produced as a "component" first, and this component is buried in a substrate, which eliminates the possibility of a defective inductor element buried in a substrate and prevents the finished inductor quality from affecting the substrate yield.

In the above example, the rectangular electrodes 112, 113, 115, 116 are formed on both ends of the two planar coils 110, 111, as shown in FIG. 3, with the holes 106, 107, 108, 109 formed at positions facing these electrodes 112, 113, 115, 116 (specified positions), but the present invention is not limited to the foregoing. For examples, the following variations are permitted.

Figure 6:
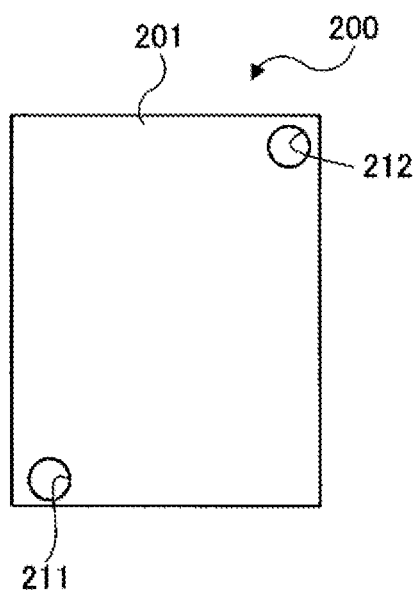
FIG. 6 illustrates plan views of a specific layer of an electronic component to be embedded in substrate 200 pertaining to the first example of variation.
Figure 6:
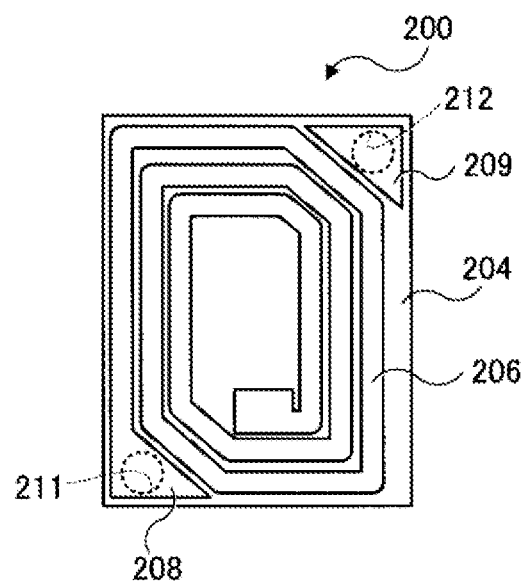
Figure 6:
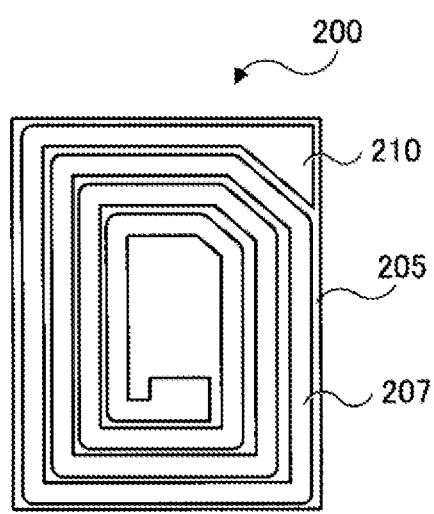
Figure 6:
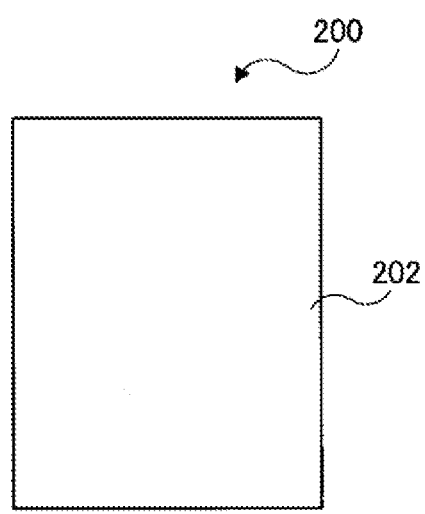

FIG. 6 provides plan views of an electronic component to be embedded in substrate 200 pertaining to the first example of variation. (a) is an overhead view of a magnetic layer 201 (corresponding to the magnetic layer 101 in FIG. 3) from above. (b) is an overhead view of a top insulation resin layer 204 (corresponding to the top insulation resin layer 104 in FIG. 3) from above, which is exposed after removing the magnetic layer 201 above it. (c) is an overhead view of a bottom insulation resin layer 205 (corresponding to the bottom insulation resin layer 105 in FIG. 3) from above, which is exposed after removing the magnetic layer 201, top insulation resin layer 204, and middle insulation resin layer (corresponding to the middle insulation resin layer 103 in FIG. 3) above it. (d) is an overhead view of a magnetic layer 202 (corresponding to the magnetic layer 102 in FIG. 3) from above, which is exposed after removing the magnetic layer 201, top and middle insulation resin layers, and bottom insulation resin layer 205 above it.

As shown in these figures, the electronic component to be embedded in substrate 200 pertaining to the first example of variation has looped planar coils 206, 207 formed on the top and bottom insulation resin layers 204, 205, with triangular electrodes 208, 209, 210 formed on both ends of these two planar coils 206, 207. Additionally, holes 211, 212 are made in the magnetic layer 201 at positions facing these terminal electrodes 208, 209, 210 (specified positions).

Also this way, the terminal electrodes 5, 6 in the example of a conventional component can be made unnecessary and the thickness of the component-embedded substrate in which this component is buried can be reduced.

In addition, placement of the triangular terminal electrodes 208, 209, 210 in corners of the top and bottom insulation resin layers 204, 205 prevents generation of any wasteful area.

Figure 7:
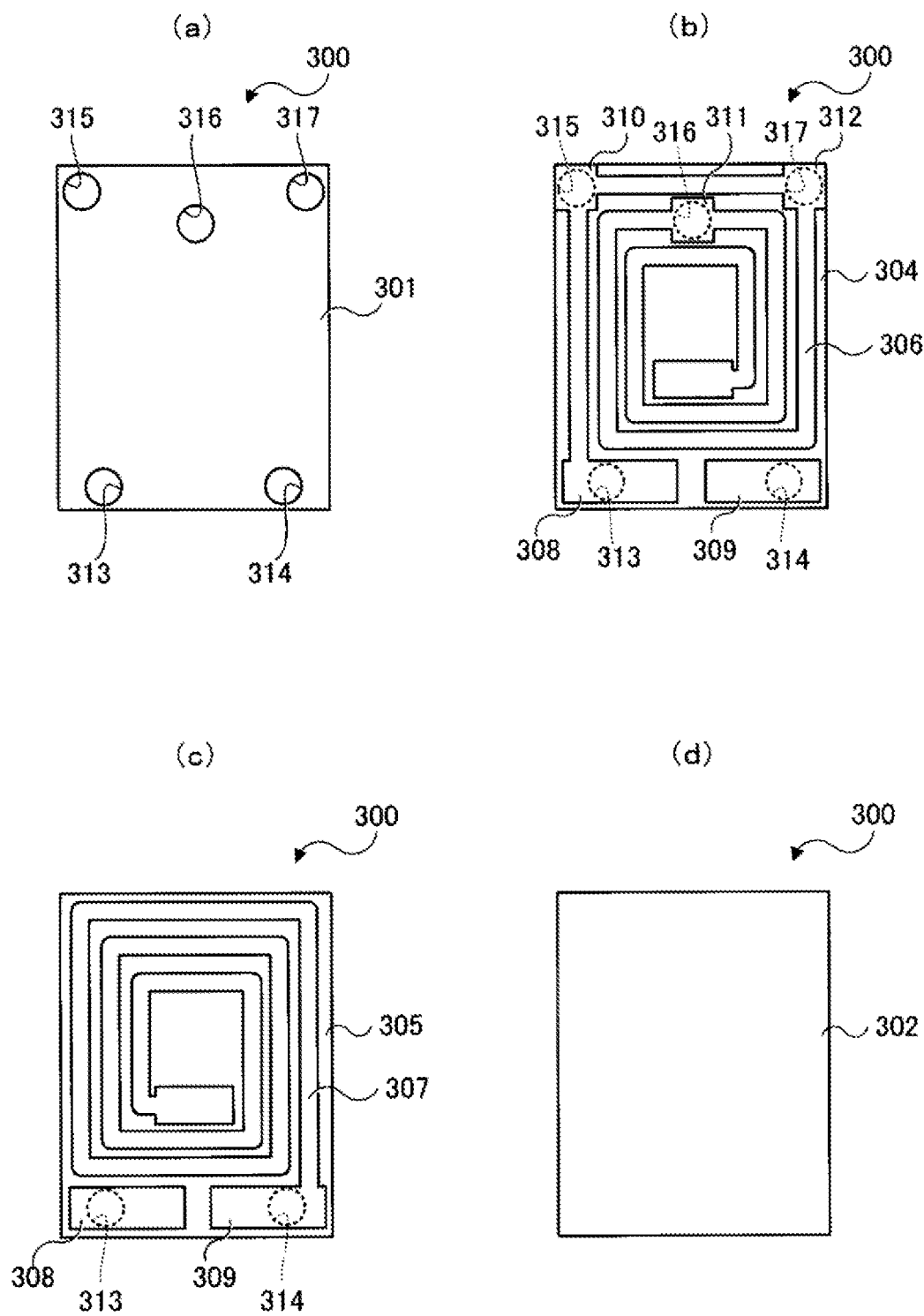
FIG. 7 illustrates plan views of a specific layer of an electronic component to be embedded in substrate 300 pertaining to the second example of variation.

FIG. 7 provides plan views of an electronic component to be embedded in substrate 300 pertaining to the second example of variation. (a) is an overhead view of a magnetic layer 301 (corresponding to the magnetic layer 101 in FIG. 3) from above. (b) is an overhead view of a top insulation resin layer 304 (corresponding to the top insulation resin layer 104 in FIG. 3) from above, which is exposed after removing the magnetic layer 301 above it. (c) is an overhead view of a bottom insulation resin layer 305 (corresponding to the bottom insulation resin layer 105 in FIG. 3) from above, which is exposed after removing the magnetic layer 301, top insulation resin layer 304, and middle insulation resin layer (corresponding to the middle insulation resin layer 103 in FIG. 3) above it. (d) is an overhead view of a magnetic layer 302 (corresponding to the magnetic layer 102 in FIG. 3) from above, which is exposed after removing the magnetic layer 301, top and middle insulation resin layers, and bottom insulation resin layer 305 above it.

As shown in these figures, the electronic component to be embedded in substrate 300 pertaining to the second example of variation has looped planar coils 306, 307 formed on the top and bottom insulation resin layers 304, 305, with rectangular electrodes 308, 309 formed on both ends of these two planar coils 306, 307. Additionally, rectangular electrodes 310, 311, 312 are formed at key positions in the middle of these two planar coils 306, 307 and holes 313, 314, 315, 316, 317 are made in the magnetic layer 301 at positions facing these terminal electrodes 308, 309, 310, 311, 312 (specified positions).

Also this way, the terminal electrodes 5, 6 in the example of a conventional component can be made unnecessary and the thickness of the component-embedded substrate in which this component is buried can be reduced.

In addition, the terminal electrodes 310, 311, 312 are formed at key positions in the middle of the planar coils 306, 307. Accordingly, selective use of these terminal electrodes 310, 311, 312 as necessary allows for fine adjustment of inductance.

Figure 8:
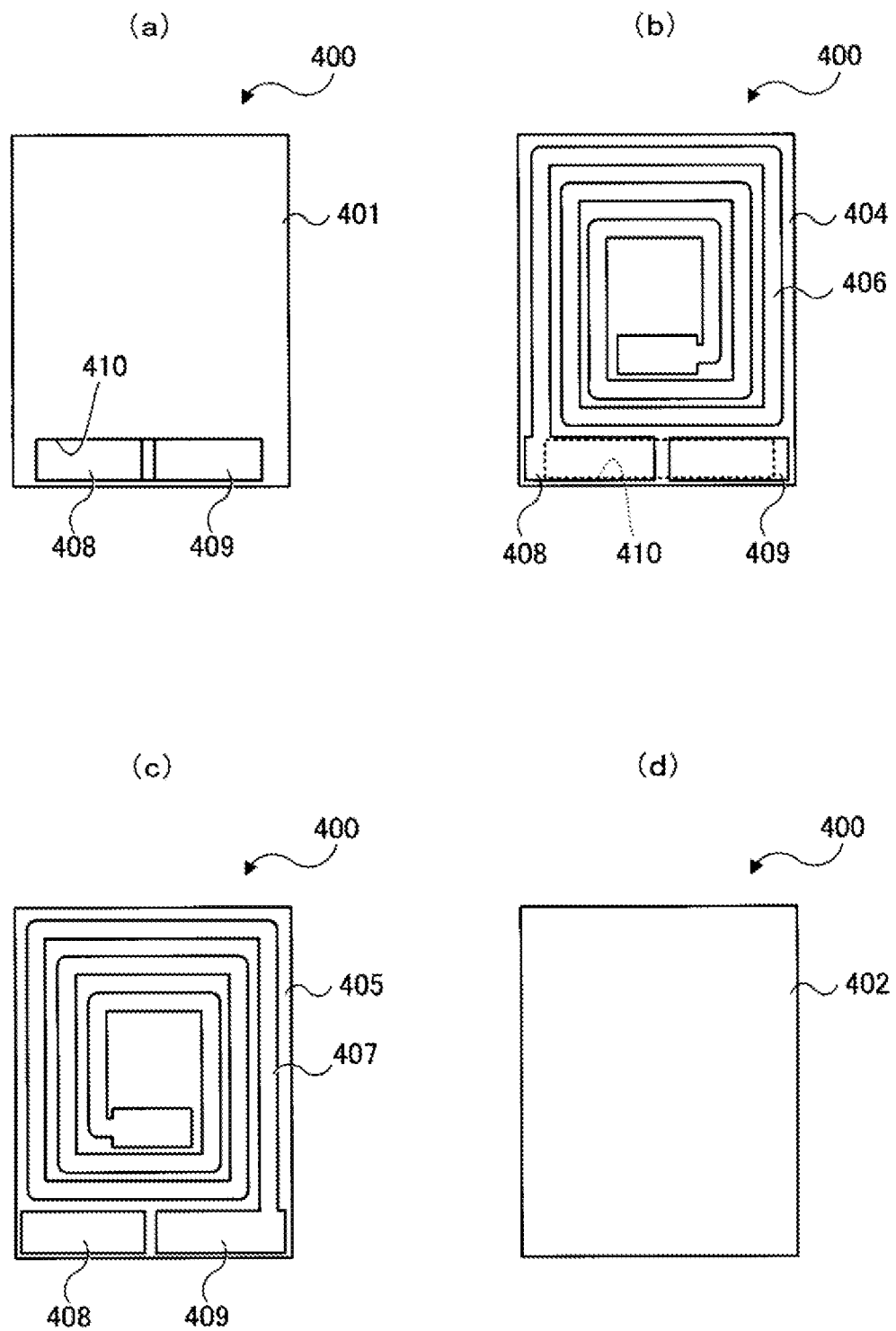
FIG. 8 illustrates plan views of a specific layer of an electronic component to be embedded in substrate 400 pertaining to the third example of variation.

FIG. 8 provides plan views of an electronic component to be embedded in substrate 400 pertaining to the third example of variation. (a) is an overhead view of a magnetic layer 401 (corresponding to the magnetic layer 101 in FIG. 3) from above. (b) is an overhead view of a top insulation resin layer 404 (corresponding to the top insulation resin layer 104 in FIG. 3) from above, which is exposed after removing the magnetic layer 401 above it. (c) is an overhead view of a bottom insulation resin layer 405 (corresponding to the bottom insulation resin layer 105 in FIG. 3) from above, which is exposed after removing the magnetic layer 401, top insulation resin layer 404, and middle insulation resin layer (corresponding to the middle insulation resin layer 103 in FIG. 3) above it. (d) is an overhead view of a magnetic layer 402 (corresponding to the magnetic layer 102 in FIG. 3) from above, which is exposed after removing the magnetic layer 401, top and middle insulation resin layers, and bottom insulation resin layer 405 above it.

As shown in these figures, the electronic component to be embedded in substrate 400 pertaining to the third example of variation has looped planar coils 406, 407 formed on the top and bottom insulation resin layers 404, 405, with rectangular electrodes 408, 409 formed on both ends of these two planar coils 406, 407. Additionally, a rectangular window 410 is formed in the magnetic layer 401 at a position facing these terminal electrodes 408, 409 (specified position).

Also this way, the terminal electrodes 5, 6 in the example of conventional component can be made unnecessary and the thickness of the component-embedded substrate in which this component is buried can be reduced.

In addition, large parts of the terminal electrodes 408, 409 are exposed according to the size of the rectangular window 410, which leads to a large contact area with the terminal electrodes 408, 409 and consequently the contact resistance can be reduced.

In the above examples, the circular holes 106 to 109, 211, 212, 313, 314, 315, 316, 317 are opened in the magnetic layers 101, 102, 201, 401 (examples of FIGS. 1, 6 and 7) and a rectangular window 410 is formed in the magnetic layer 301 (example of FIG. 8), but the present invention is not limited to the foregoing. For example, the following is also permitted.

Figure 9:
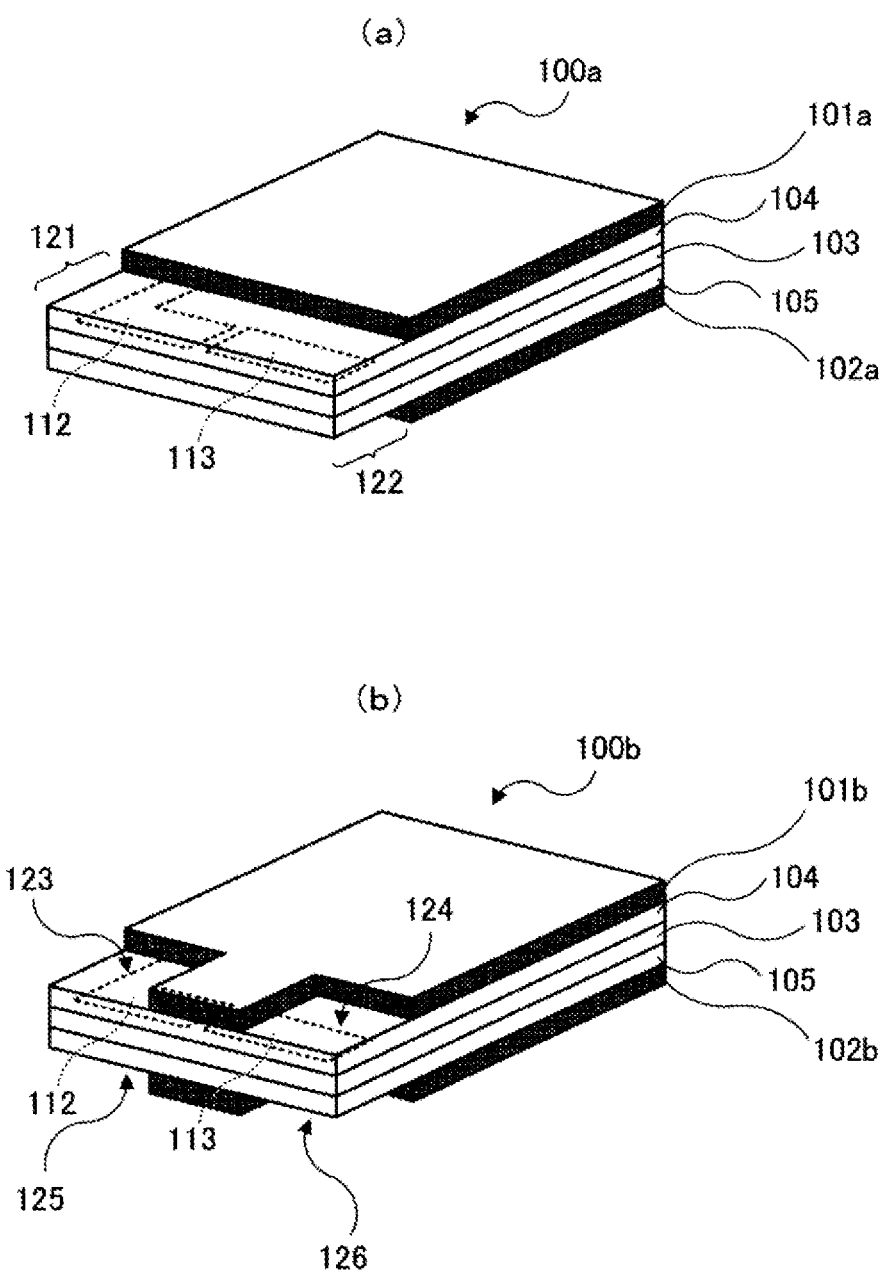
FIG. 9 illustrates perspective views showing different examples of the structure of electronic component to be embedded in substrate.

FIG. 9 provides drawings showing different examples of the structure of electronic components to be embedded in substrate. Components common to those in FIG. 1 are given the same reference numerals. As shown in (a) of this figure, the electronic component to be embedded in substrate 100a is an inductor element that has three insulation resin layers, or specifically a middle insulation resin layer 103, a top insulation resin layer 104, and a bottom insulation resin layer 105, sandwiched between a pair of magnetic layers 101a, 102a facing each other at a specified interval in between, after which planar coils (refer to reference numerals 110, 111 in FIG. 3) are formed on the top and bottom insulation resin layers 104, 105. The constitution is such that the top magnetic layer 101a and bottom magnetic layer 102a are partially cut off and the cutoff parts are used as absent parts 121, 122. Here, "cut off" generally means removing a part of an object, but such narrow interpretation is not adopted here. In addition to removal, it also means forming the magnetic layers 101a, 102a by excluding the absent parts 121, 122 from the beginning.

This way, the electrodes 112, 113 of the planar coils can still be exposed through the absent parts 121, 122 formed in the magnetic layers 101a, 102a. In this case, the positions (specified positions) of the absent parts 121, 122 also face the electrodes 112, 13 of the planar coils.

In this example, the absent parts 121, 122 have a band shape, but the present invention is not limited to the foregoing and, for example, rectangular absent parts 123 to 126 may be created by cutting off the corners of the magnetic layers 101b, 102b, as is the case with the electronic component to be embedded in substrate 100b shown in (b) of this figure. Similarly, the electrodes 112, 113 of the planar coils can be exposed through the absent parts 123 to 126 formed in the magnetic layers 101b, 102b. The absent parts 123 to 126 can have a shape other than rectangular. For example, they can have a circular, oval, U-shaped or any other desired shape. A shape that allows for easy production can be selected as deemed appropriate. Regardless of their shape, the absent parts 123 to 126 will have positions facing the electrodes 112, 113 of the planar coils (specified positions).

Also in (a) and (b) of this figure, preferably the top insulation resin layer 104 and bottom insulation resin layer 105 are not removed from the absent parts 121, 122, 123 to 126, but kept as is. This is to protect the electrodes 112, 113 with the top insulation resin layer 104 and bottom insulation resin layer 105 to keep them from contacting air, which in turn prevents deterioration of the electronic component to be embedded in substrate, either 100a or 100b, during long-term storage, for example. In fact, this idea (protecting the electrodes 112, 113) can also be applied to the structure in FIG. 1 explained earlier, or specifically the one where the circular holes 106, 107 are provided for taking out the electrodes in the top magnetic layer 101 and bottom magnetic layer 102.

Component-Embedded Substrate

First Example

Next, a component-embedded substrate in which one of the electronic components to be embedded in substrate 100, 100a, 100b, 200, 300, 400 explained earlier is embedded, is explained.

Figure 10:
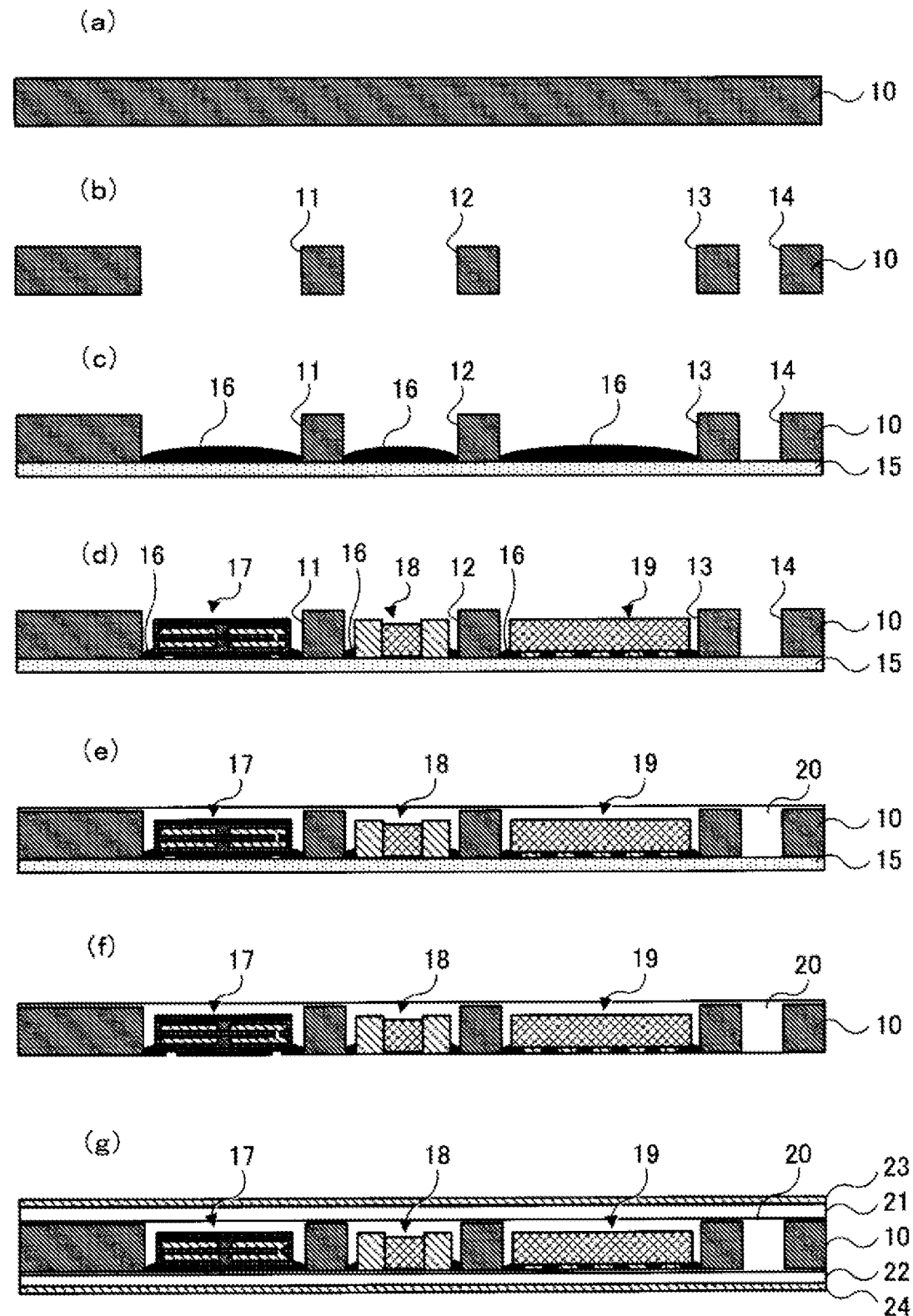
FIG. 10 illustrates section views showing an overview of manufacturing steps of a component-embedded substrate (first example/part 1).
Figure 11:
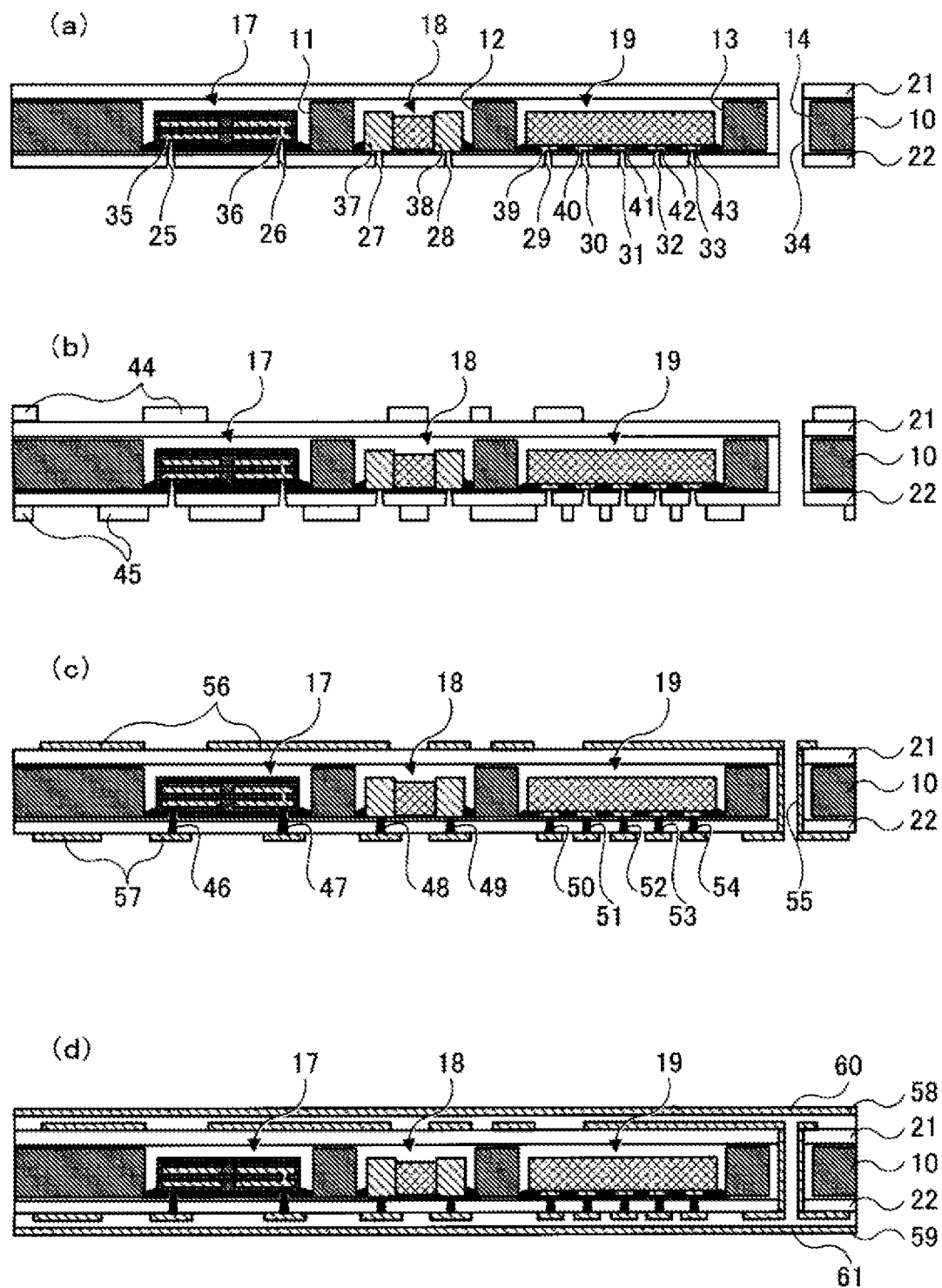
FIG. 11 illustrates section views showing an overview of manufacturing steps of a component-embedded substrate (first example/part 2).
Figure 12:
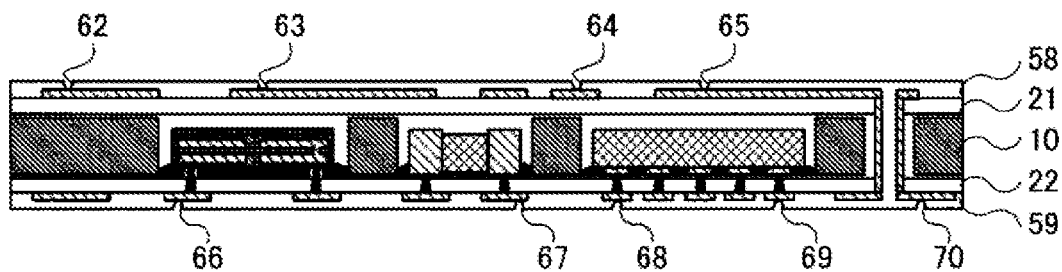
FIG. 12 illustrates section views showing an overview of manufacturing steps of a component-embedded substrate (first example/part 3).
Figure 12:
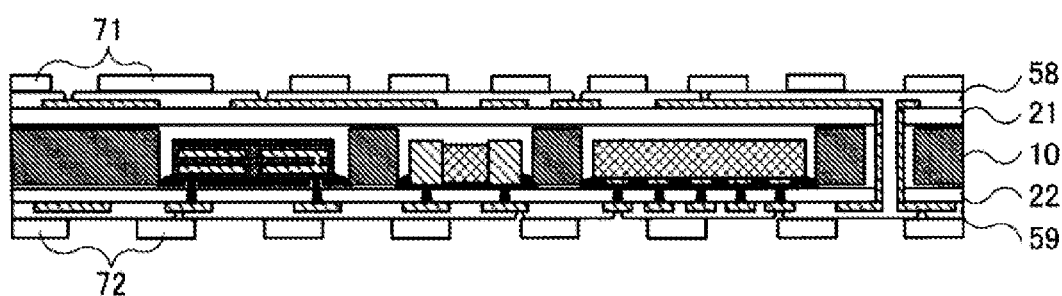
Figure 12:
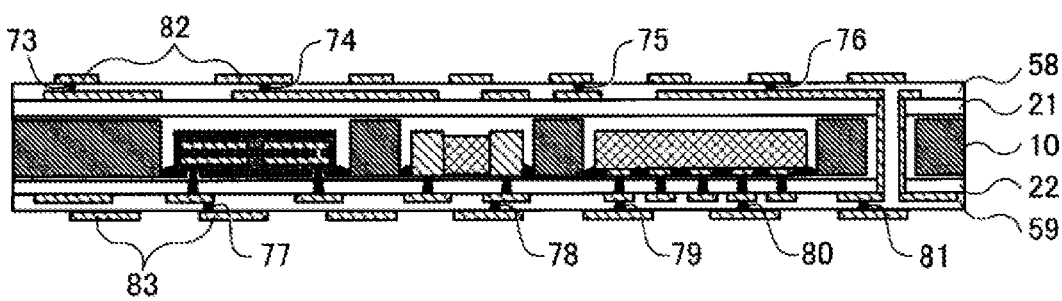
Figure 12:
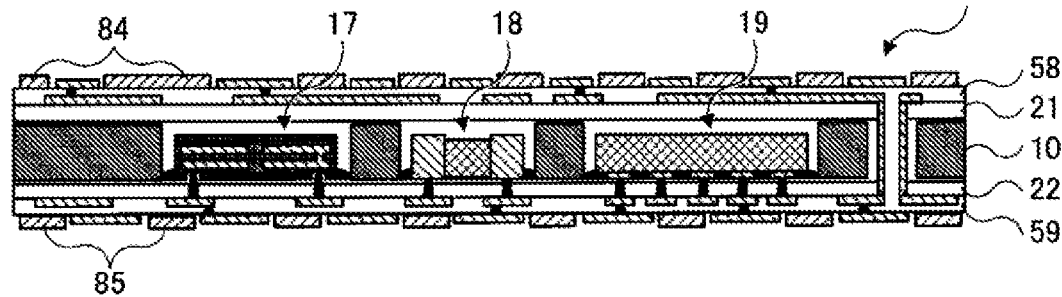

FIGS. 10 to 12 are manufacturing process charts of component-embedded substrate.

[First Step]—FIG. 10(a)

First, a base material (hereinafter referred to as "core substrate 10") is prepared. This core substrate 10 will become the backbone of the component-embedded substrate. For this, copper or other metal, resin, ceramics, etc., can be used, for example, but copper or other metal is preferable because electrical shielding effect can be achieved. The thickness of the core substrate 10 is such that the thickest types of electronic components to be embedded in substrate explained later, or specifically semiconductor integrated circuits, inductor elements, resistive elements, capacitive elements, etc., can be buried sufficiently.

If metal is to be used for the core substrate 10, copper, gold, silver or other precious metal or iron, iron alloy, Ni alloy, etc., is easy to use. If resin is to be used, epoxy resin, polyimide resin, cyanate resin, thermosetting polyolefin resin, thermosetting polyphenylene ether resin or other thermosetting resin, or liquid crystal polymer, polyether ether ketone, polyphenylene sulfide or other thermoplastic resin can be used, among others. Any such resin may be impregnated in a glass nonwoven fabric or resin nonwoven fabric or a filler may be dispersed in the resin. For the filler, silica, alumina, magnesium oxide, titanium oxide, talc or other metal oxide can be used, for example, but other choices include aluminum hydroxide, magnesium hydroxide, etc. In addition, the filler may have a spherical, crushed, sheet-like, whisker, fiber or other shape. If ceramics are to be used, alumina or other LTCC material, or BT or other capacitor material, can be used, among others.

[Second Step]—FIG. 10(b)

Next, through holes 11 to 14 are made in specified parts of the core substrate 10. These through holes 11 to 14 are used to bury electronic components to be embedded in substrate explained later, or as connection paths to electrically connect the front side and back side of the substrate. Here, the three through holes from the left as shown in the figure, or namely 11 to 13, are used for component-burying purposes, while the one through hole 14 at the far right is used as a connection path; however, these allocations are only for the sake of convenience of illustration.

[Third Step]—FIG. 10(c)

Next, a resin sheet 15 is attached on one side (bottom side in the figure) of the core substrate 10. This resin sheet 15 is preferably "peelable" after sealing of resin, but it need not always be peeled. Its material is not limited in any way, as long as it offers insulation property. If resin or other soft material is used for the resin sheet 15, for example, a copper foil or other reinforcement sheet can be attached and the resulting resin/copper foil laminate sheet may be used. Next, an appropriate amount of liquid-type, film-type or other tacky component-fixing resin 16 is applied on the top side of the resin sheet 15 as shown in the figure, or specifically the bottoms of the component-burying through holes 11, 12, 13 among the through holes 11 to 14. Adhesive may be used in place of the component-fixing resin 16.

[Fourth Step]—FIG. 10(d)

Next, required electronic components to be embedded in substrate, or specifically an inductor element 17, a resistive element 18, and a semiconductor integrated circuit 19 in this case, are inserted into the corresponding through holes 11, 12, 13, respectively, and then pressed lightly against the resin sheet 15 in the holes to loosely secure the components using the tack strength of the component-fixing resin 16 applied on the resin sheet 15.

Among the illustrated electronic components to be embedded in substrate, the "inductor element 17" has a structure specific to this embodiment, or specifically a structure that allows for thickness reduction, and corresponds to one of the electronic components to be embedded in substrate 100, 100a, 100b, 200, 300, 400 explained earlier. Of the remaining electronic components to be embedded in substrate, the resistive element 18 can be replaced with a capacitive element and read as such, for example.

[Fifth Step]—FIG. 10(e)

Next, the electronic components to be embedded in substrate, such as the inductor element 17, resistive element 18 and semiconductor integrated circuit 19, are sealed. This sealing is implemented by preparing a sheet-shaped sealing resin 20 which is thick enough to be able to fill the internal volumes of the through holes 11 to 14, or specifically the volumes excluding the solid volumes of the electronic components to be embedded in substrate, pressing it with a specified force from above the top side of the substrate to cause the resin to flow in a manner fully filling the gaps around the electronic components to be embedded in substrate, and then applying specified heat, such as heat of approx. 160 to 200° C., to cure the sealing resin 20. For this sealing resin 20, it is also possible to attach a copper foil or other reinforcement sheet and use the resulting resin/copper foil laminate sheet. The functions required of the sealing resin 20 are low linear expansion and insulation property. In other words, any material can be used as long as it has sufficient flowability to fill the space without leaving gaps and also offers sufficient characteristics (insulation property, etc.) as an insulation substrate. Therefore, any thermosetting resin or thermoplastic resin can be used for the sealing resin as long as it is an insulation resin that can be softened by means of heating at approx. 150 to 400° C. and provide sealing. Furthermore, preferably the resin used in this step fills the holes 106 to 109 and absent parts 121, 122 or 123, 124 provided in the inductor element 17 so as to completely fill the gaps around the electronic component to be embedded in substrate.

[Sixth Step]—FIG. 10(f)

Next, the resin sheet 15 is peeled. This peeling can be done by means of heat, light or melting, for example.

It should be noted that the resin sheet 15 need not always be peeled. This is because the role of the resin sheet 15 in the first example is simply to create bottoms of the component-burying through holes 11, 12, 13, or specifically application surfaces for the component-fixing resin 16 and surfaces on which to place the electronic components. In addition, these "bottoms" need not be removed even after the electronic components have been placed. If the resin sheet 15 is not peeled, the resins 21, 22 explained later will become no longer necessary. This means that, as the resin sheet 15 serves as "bottoms," peeling this resin sheet 15 removes the "bottoms." That is why the resins 21, 22 are needed as a replacement in the seventh step explained later. Accordingly, there are two options, the first of which is not to peel the resin sheet 15 to eliminate the need for the resins 21, 22 explained later, and the second option is to peel the resin sheet 15 and attach the resins 21, 22 explained later. In this first example, the second option is adopted and the resin sheet 15 is peeled. However, this selection is only for the sake of convenience of explanation and either option may be adopted according to the actual situation.

[Seventh Step]—FIG. 10(g)

Next, the resins 21, 22 are attached to the front side and back side of the substrate and then cured by means of heating, for example, to form a buildup layer on each side. For these resins 21, 22, too, copper foil or other reinforcement sheets 23, 24 may be attached and the resulting resin/copper foil laminate sheets may be used. Alternatively, PET film or other resin film may be attached instead of copper foil. In any event, these reinforcement sheets (copper foil, PET, etc.) 23, 24 are not a requirement.

[Eighth Step]—FIG. 11(a)

Next, the reinforcement sheets 23, 24 of the buildup layers are removed and via holes 25 to 33 and through hole 34 are formed at key locations. Here, the via holes 25, 26 are formed at positions corresponding to terminal electrodes 35, 36 of the inductor element 17, the via holes 27, 28 are formed at positions corresponding to terminal electrodes 37, 38 of the resistive element 18, and the via holes 29 to 33 are formed at positions corresponding to terminal electrodes 39 to 43 of the semiconductor integrated circuit 19.

These via holes 25 to 33 and through hole 34 can be formed using a laser, but they can also be formed by photolithography if light-curing resin is used for the resins 21, 22 of the buildup layers. As for the through hole 34, it can be formed by mechanical means such as a drill or router.

The via holes 25 to 33 are sized to ensure sufficient electrical continuity with the respective terminal electrodes of the electronic component to be embedded in substrate 100. However, preferably the via holes of the inductor element 17 have a slightly smaller diameter than the width of the shorter side of the terminal electrodes 112 to 116. For example, a preferred diameter of the via hole is equal to or slightly smaller than the width of the shorter side of the terminal electrodes 112 to 116 of the inductor element 17. In addition, preferably the via holes do not contact the edges of the holes 106 to 109 in the magnetic layers 101, 102. This is because the conductors formed in the via holes create conductive paths to the inductor element 17 and if these conductors contact the magnetic layers 101, 102, the inductance of the inductor element 17 will drop. The same applies to the other examples explained later.

[Ninth Step]—FIG. 11(b)

Next, the resins 21, 22 of the buildup layers are covered with resists 44, 45 and the resists 44, 45 are exposed and developed into specified pattern shapes.

[Tenth Step]—FIG. 11(c)

Next, the via holes 25 to 33 are filled with conductive materials 46 to 54, while conductive material 55 is formed on the interior wall of the through hole 34, after which wirings 56, 57 are formed on the surface of the buildup layers and then the resists 44, 45 are removed. The conductive materials 46 to 54 may be plating, or conductive resin, etc., may be used.

[Eleventh Step]—FIG. 11(d)

Next, second buildup layers are formed. These second buildup layers can also be formed using the same method employed in the seventh step mentioned earlier. To be specific, resins 58, 59 are attached on top of the first buildup layers and then cured to form the second buildup layers. For these resins 58, 59, too, copper foil or other reinforcement sheets 60, 61 can be attached and the resulting resin/copper film laminate sheets may be used, for example. Alternately, PET film or other resin film may be attached instead of copper foil.

[Twelfth Step]—FIG. 12(a)

Next, the reinforcement sheets 60, 61 of the second buildup layers are removed and via holes 62 to 70 are formed at specified positions of the resins 58, 59. These via holes 62 to 70 can also be formed using a laser.

[Thirteenth Step]—FIG. 12(b)

Next, the resins 58, 59 of the second buildup layers are covered with resists 71, 72 and the resists 71, 72 are exposed and developed into specified pattern shapes.

[Fourteenth Step]—FIG. 12(c)

Next, the via holes 62 to 70 in the second buildup layers are filled with conductive materials 73 to 81, after which wirings 82, 83 are formed on the surface of the second buildup layers and then the resists 71, 72 are removed. The conductive materials 73 to 81 may be plating, or conductive resin, etc., may be used.

[Fifteenth Step]—FIG. 12(d)

Lastly, the front side and back side of the substrate are covered with solder resists (also called "green resists") 84, 85 to form protective films to complete a component-embedded substrate 86.

While two buildup layers are formed per side in the above steps, only one layer, or three or more layers may be formed.

As explained above, the component-embedded substrate 86 in this first example allows the electrodes to be led out onto the substrate surface via the conductive materials 46 to 54, 77 to 81 directly from the "bottom sides" of the inductor element 17, resistive element 18, and semiconductor integrated circuit 19. Also because the inductor element 17 is thinner than the example of conventional component mentioned at the beginning (refer to FIG. 20), the thickness of the component-embedded substrate 86 can be reduced.

Component-Embedded Substrate

Second Example

Figure 13:
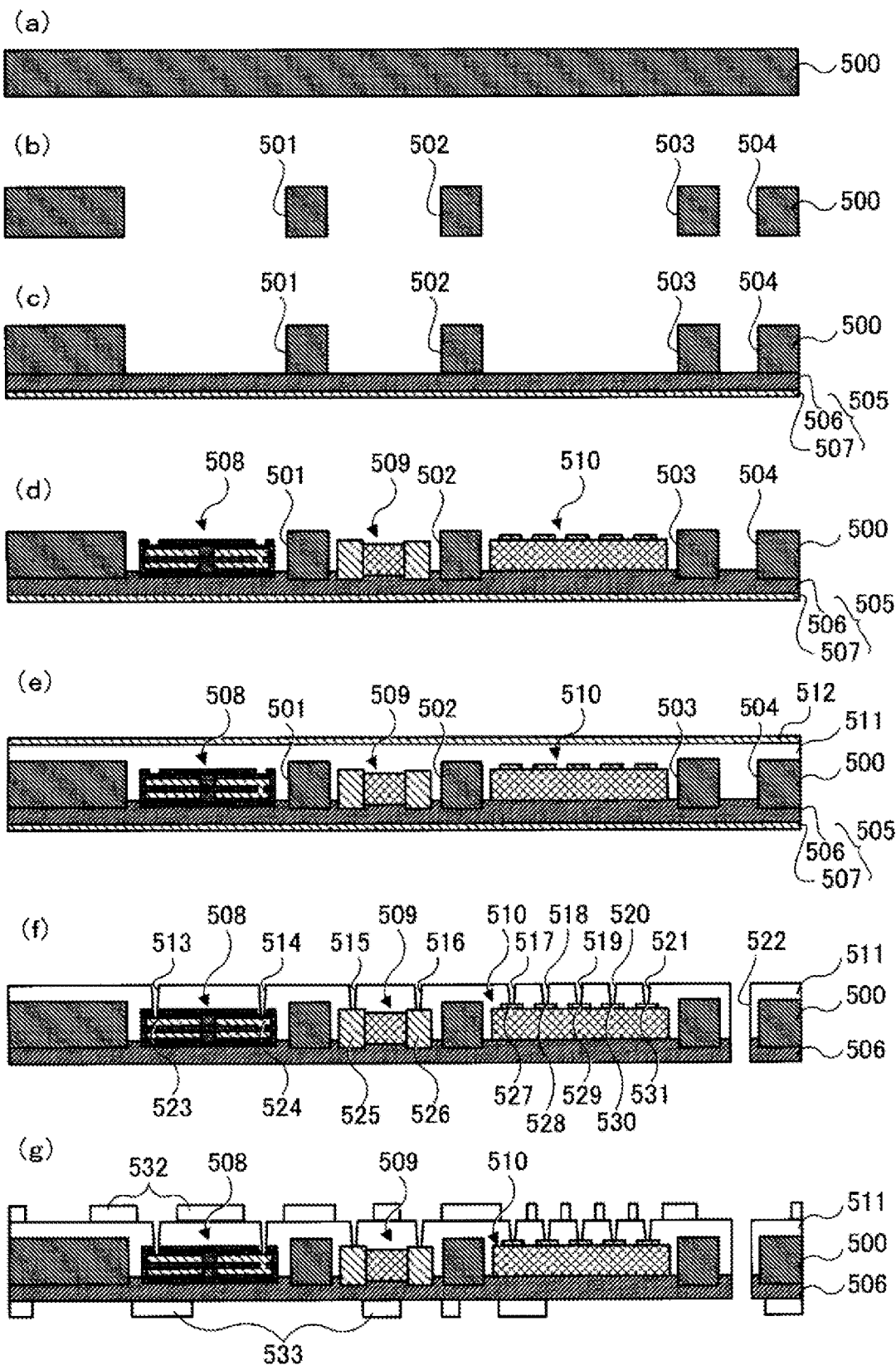
FIG. 13 illustrates section views showing an overview of manufacturing steps of a component-embedded substrate (second example/part 1).
Figure 14:
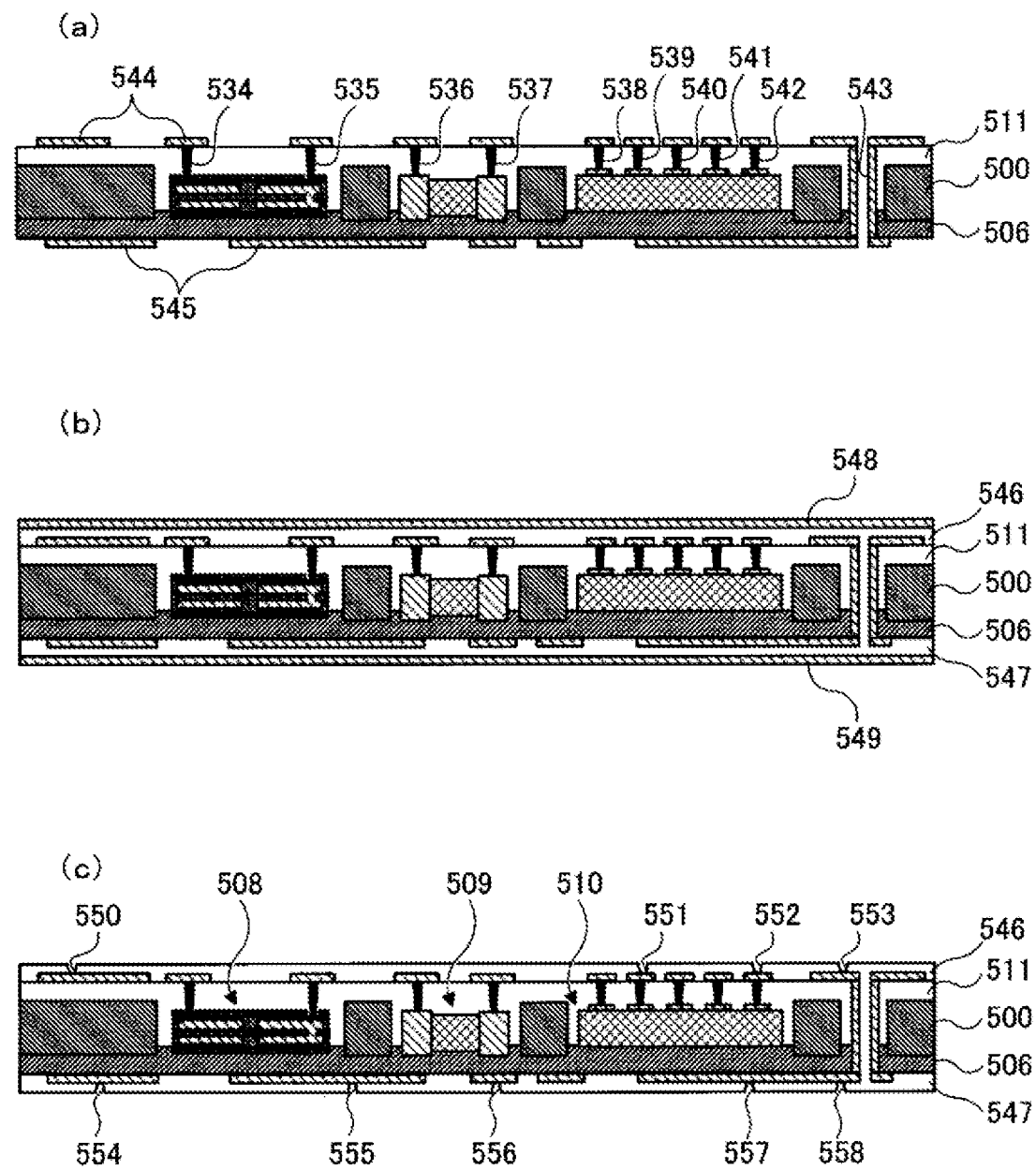
FIG. 14 illustrates section views showing an overview of manufacturing steps of a component-embedded substrate (second example/part 2).
Figure 15:
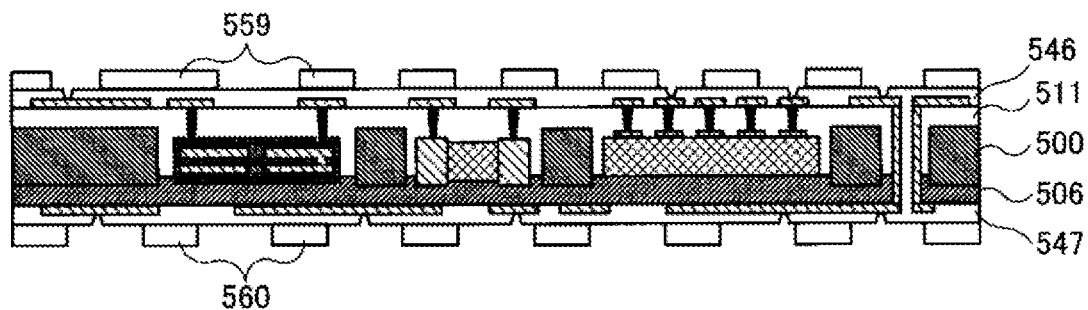
FIG. 15 illustrates section views showing an overview of manufacturing steps of a component-embedded substrate (second example/part 3).
Figure 15:
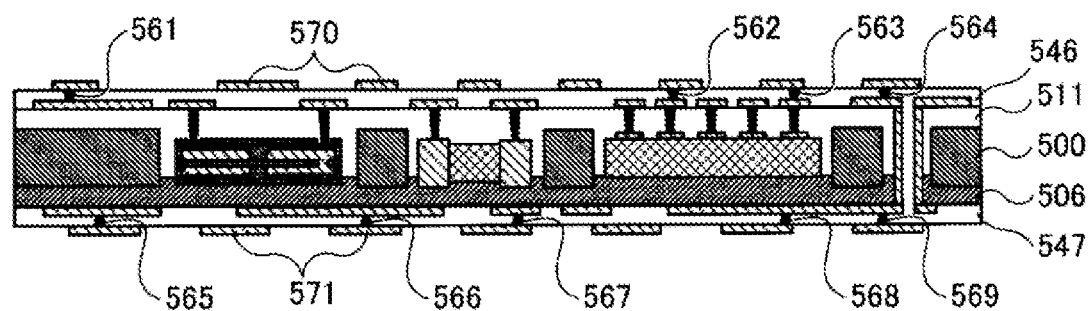
Figure 15:
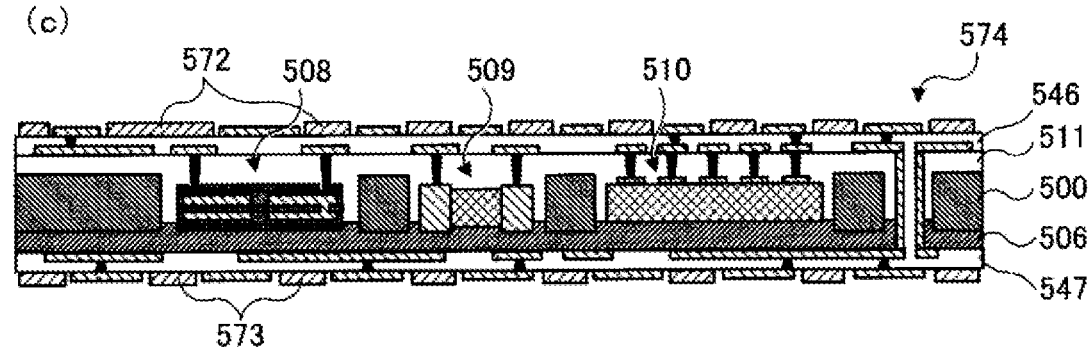

FIGS. 13 to 15 are the second example of manufacturing process charts of component-embedded substrate.

[First Step]—FIG. 13(a)

First, a base material (hereinafter referred to as "core substrate 500") is prepared. This core substrate 500 will become the backbone of the component-embedded substrate. For this, copper or other metal, resin, ceramics, etc., can be used, for example, but copper or other metal is preferable because electrical shielding effect can be achieved. The thickness of the core substrate 500 is such that the thickest types of electronic components to be embedded in substrate explained later, or specifically semiconductor integrated circuits, inductor elements, resistive elements, capacitive elements, etc., can be buried sufficiently.

If metal is to be used for the core substrate 500, the same materials cited for the core substrate 10 in the first example can be used and thus they are not explained here.

[Second Step]—FIG. 13(b)

Next, through holes 501 to 504 are made in specified parts of the core substrate 500. These through holes 501 to 504 are used to bury electronic components to be embedded in substrate explained later, or as connection paths to electrically connect the front side and back side of the substrate. Here, the three through holes from the left as shown in the figure, or namely 501 to 503, are used for component-burying purposes, while the one through hole 504 at the far right is used as a connection path; however, these allocations are only for the sake of convenience of illustration.

[Third Step]—FIG. 13(c)

Next, a resin sheet 505 is attached on one side (bottom side in the figure) of the core substrate 500. Heat may be applied as the sheet is attached. The resin sheet 505 is a laminate of a thermosetting insulation resin layer 506 and copper foil, PET, or other reinforcement layer 507 here, but the sheet is not limited to the foregoing. The resin sheet 505 may be constituted by the insulation resin layer 506 alone.

[Fourth Step]—FIG. 13(d)

Next, required electronic components to be embedded in substrate, or specifically an inductor element 508, a resistive element 509, and a semiconductor integrated circuit 510 in this case, are inserted into the corresponding through holes 501, 502, 503, respectively, and then pressed against the resin sheet 505 in the holes with a specified force to loosely secure the components using the tack strength of the resin sheet 505. Heat may be applied during this loose securing process.

Among the illustrated electronic components to be embedded in substrate, the "inductor element 508" has a structure specific to this embodiment (structure that allows for thickness reduction), and corresponds to one of the electronic components to be embedded in substrate 100, 100a, 100b, 200, 300, 400 explained earlier. Of the remaining electronic components to be embedded in substrate, the resistive element 509 can be replaced with a capacitive element and read as such, for example.

[Fifth Step]—FIG. 13(e)

Next, the electronic components to be embedded in substrate, such as the inductor element 508, resistive element 509, and semiconductor integrated circuit 510, are sealed. This sealing is implemented by preparing a sheet-shaped sealing resin layer 511 which is thick enough to be able to fill the depths of the through holes 501 to 504, pressing it with a specified force from above the top side of the substrate to cause the resin to flow in a manner fully filling the gaps around the electronic components to be embedded in substrate, and then applying specified heat, such as heat of approx. 160 to 200° C., to cure the sealing resin layer 511. Fully filling the gaps using resin in this step is exactly the same as in the first example, and thus not explained.

For this sealing resin layer 511, it is also possible to attach a copper foil or other reinforcement sheet 512. The functions required of the sealing resin layer 511 are low linear expansion and insulation property. In other words, any material can be used as long as it has sufficient flowability to fill the space without leaving gaps and also offers sufficient characteristics (insulation property, etc.) as an insulation substrate.

[Sixth Step]—FIG. 13(f)

Next, the reinforcement layer 507 and reinforcement sheet 512 are removed, and via holes 513 to 521 and through hole 522 are formed at key locations of the sealing resin layer 511. Here, the via holes 513, 514 are formed at positions corresponding to electrodes 523, 524 of the inductor element 508, the via holes 515, 516 are formed at positions corresponding to electrodes 525, 526 of the resistive element 509, and the via holes 517 to 521 are formed at positions corresponding to electrodes 527 to 531 of the semiconductor integrated circuit 510. The sizes of these via holes are the same as in the first example and thus not explained.

These via holes 513 to 521 and through hole 522 can be formed using a laser, but they can also be formed by photolithography if light-curing resin is used for the sealing resin layer 511. As for the through hole 522, it can be formed by mechanical means such as a drill or router.

[Seventh Step]—FIG. 13(g)

Next, the insulation resin layer 506 and sealing resin layer 511 are covered with resists 532, 533 and the resists 532, 533 are exposed and developed into specified pattern shapes.

[Eighth Step]—FIG. 14(a)

Next, the via holes 513 to 521 are filled with conductive materials 534 to 542, while conductive material 543 is formed on the interior wall of the through hole 522, after which wirings 544, 545 are formed on the surface of the insulation resin layer 506 and sealing resin layer 511, and then the resists 532, 533 are removed. The conductive materials 534 to 543 may be plating, or conductive resin, etc., may be used.

[Ninth Step]—FIG. 14(b)

Next, a buildup layer is formed on both faces of the substrate. These buildup layers are formed by attaching and curing resins 546, 547 on the insulation resin layer 506 and sealing resin layer 511. For these resins 546, 547, too, copper foil or other reinforcement sheets 548, 549 may be attached (to use the resulting resin/copper foil laminate sheets), or PET film or other resin film may be attached instead of copper foil.

[Tenth Step]—FIG. 14(c)

Next, the reinforcement sheets 548, 549 of the buildup layers are removed and via holes 550 to 558 are formed at specified positions of the resins 546, 547. These via holes 550 to 558 can also be formed using a laser.

[Eleventh Step]—FIG. 15(a)

Next, the resins 546, 547 of the buildup layers are covered with resists 559, 560 and the resists 559, 560 are exposed and developed into specified pattern shapes.

[Twelfth Step]—FIG. 15(b)

Next, the via holes 550 to 558 in the buildup layers are filled with conductive materials 561 to 569, after which wirings 570, 571 are formed on the surface of the buildup layers and then the resists 559, 560 are removed. The conductive materials 561 to 569 may be plating, or conductive resin, etc., may be used.

[Thirteenth Step]—FIG. 15(c)

Lastly, the front side and back side of the substrate are covered with solder resists (also called "green resists") 572, 573 to form protective films to complete a component-embedded substrate 574.

While one buildup layer is formed per side in the above steps, two or more layers may be formed.

As explained above, the component-embedded substrate 574 in this second example allows the electrodes to be led out onto the substrate surface via the conductive materials 534 to 542, 561 to 563 directly from the "top sides" of the inductor element 508, resistive element 509, and semiconductor integrated circuit 510. Also because the inductor element 508 is thinner than the example of conventional component mentioned at the beginning (refer to FIG. 20), the thickness of the component-embedded substrate 574 can be reduced.

Component-Embedded Substrate

Third Example

Figure 16:
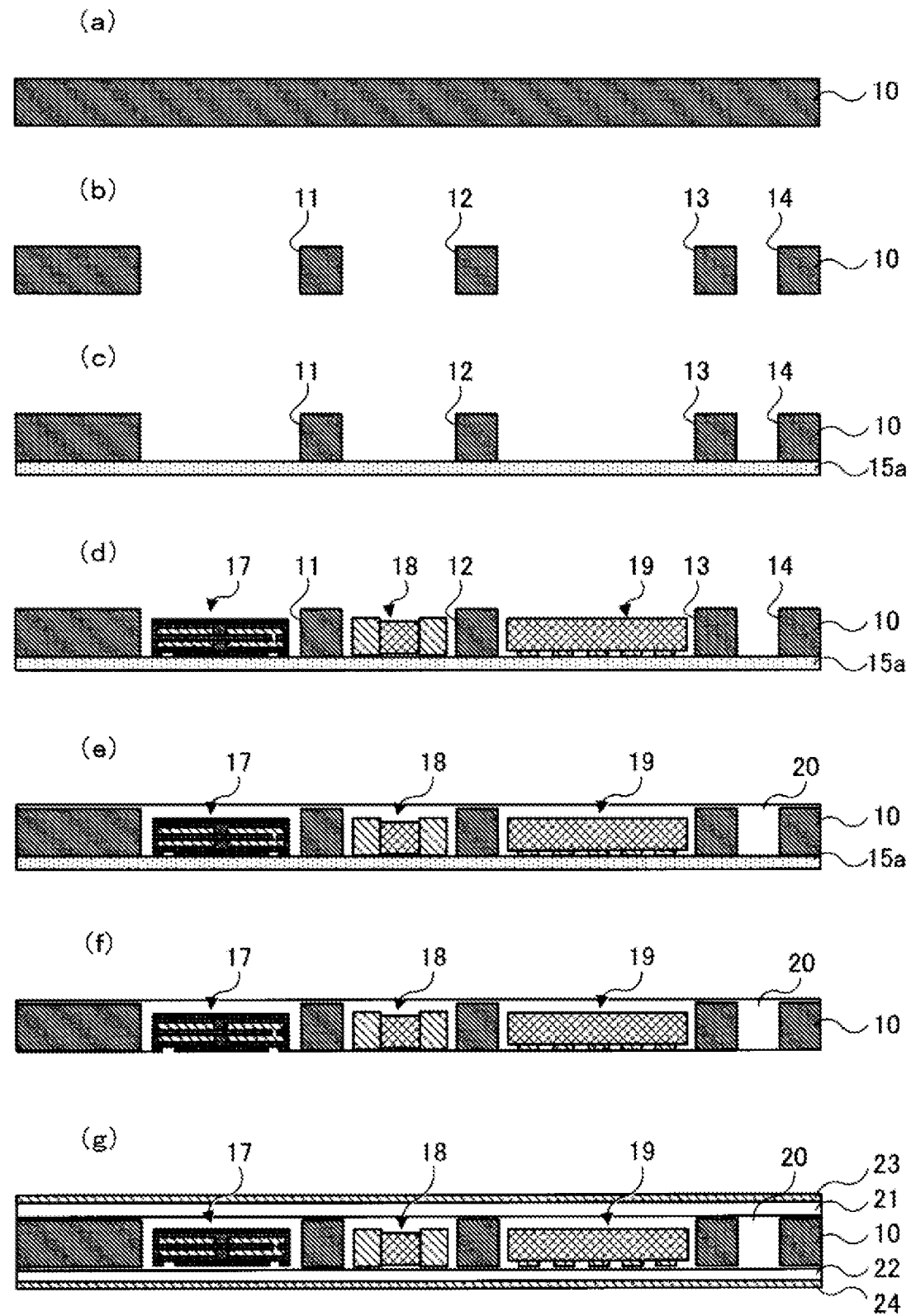
FIG. 16 illustrates section views showing an overview of manufacturing steps of a component-embedded substrate (third example/part 1).
Figure 17:
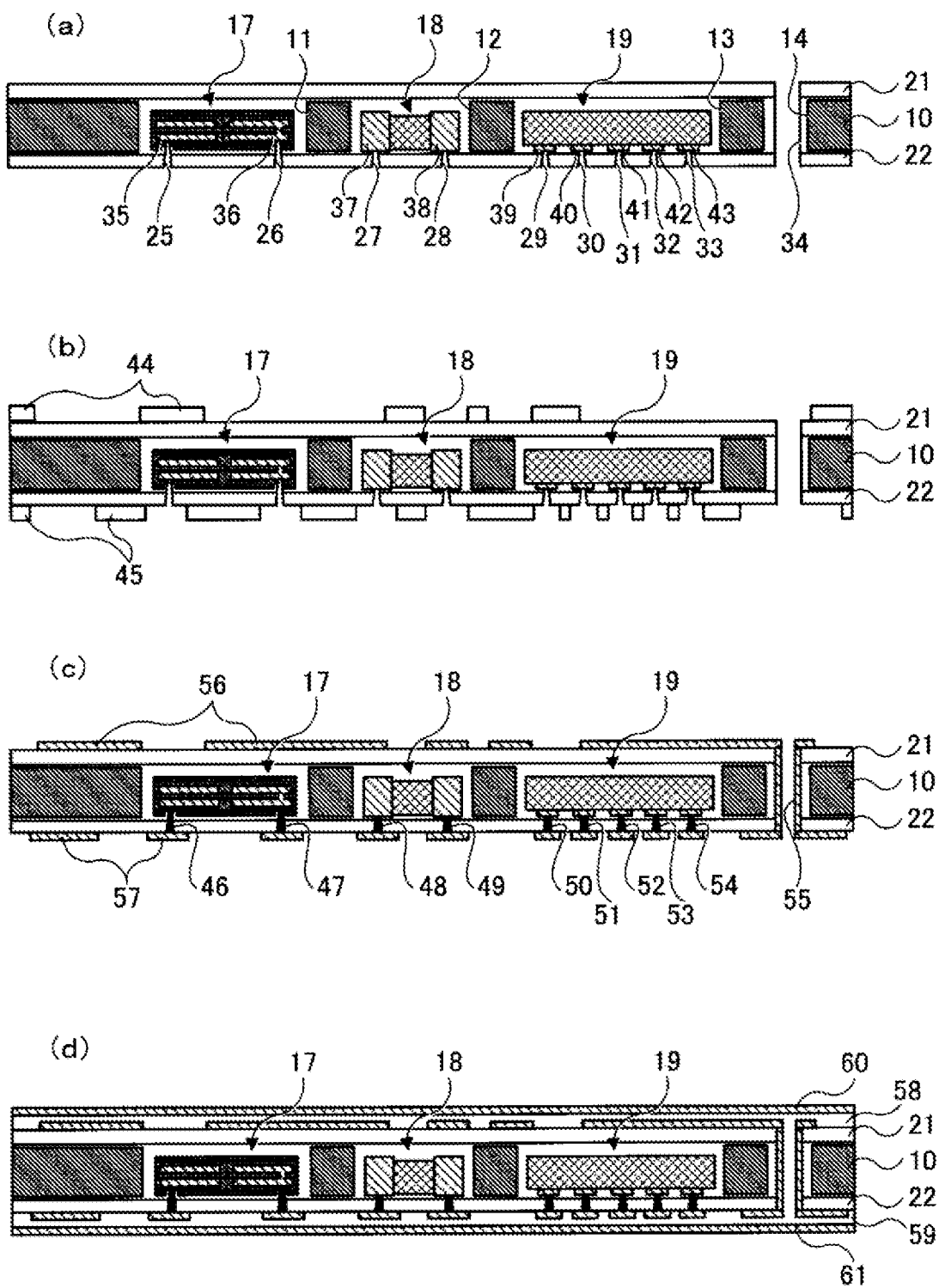
FIG. 17 illustrates section views showing an overview of manufacturing steps of a component-embedded substrate (third example/part 2).
Figure 18:
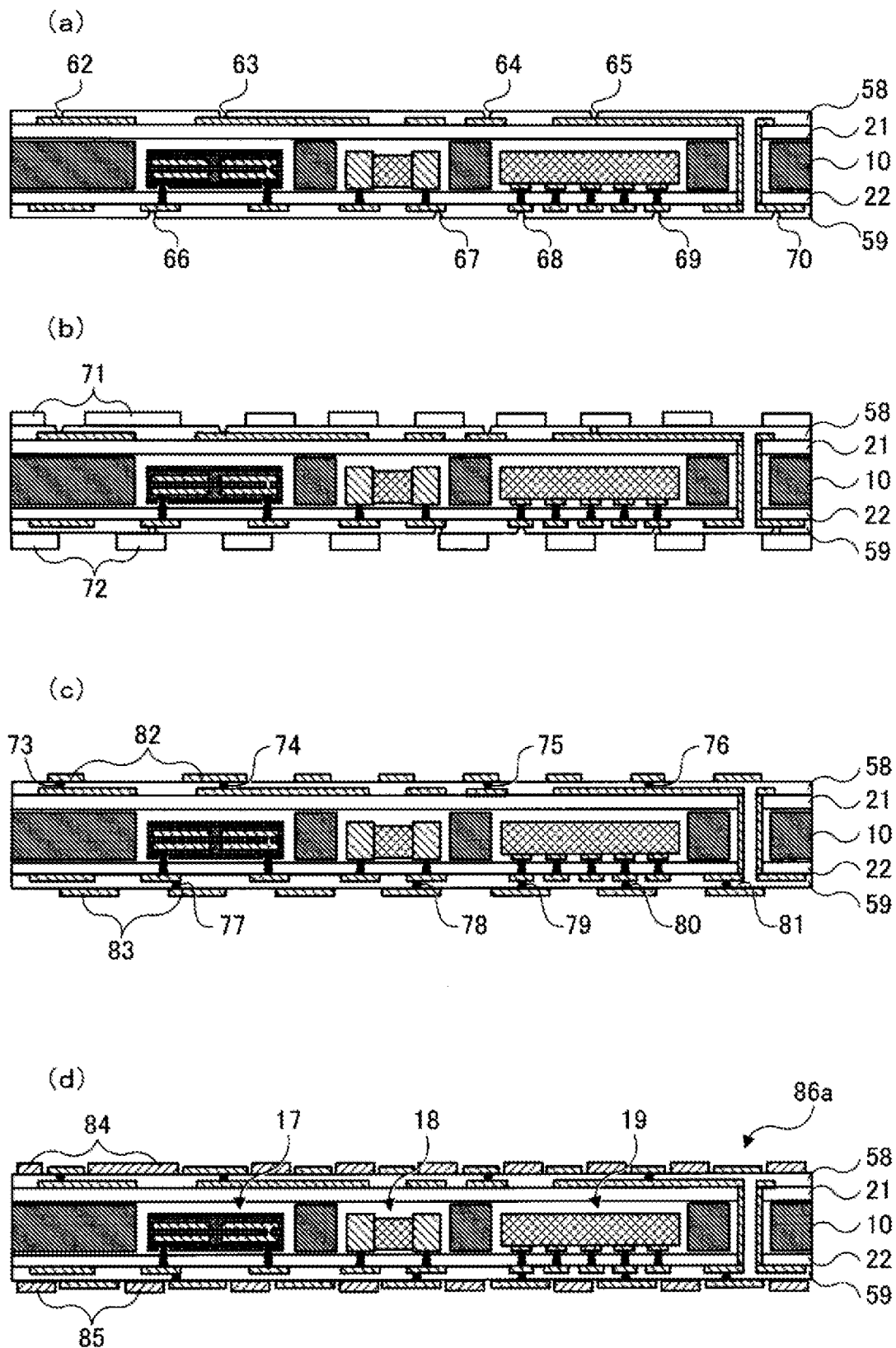
FIG. 18 illustrates section views showing an overview of manufacturing steps of a component-embedded substrate (third example/part 3).

FIGS. 16 to 18 are the third example of manufacturing process charts of component-embedded substrate. This third example is a variation of the first example (refer to FIGS. 10 to 12) above, and the components common to the first example are given the same reference numerals. The difference from the first example is that a component-securing resin 16 is not used.

[First Step]—FIG. 16(a)

First, a base material (hereinafter referred to as "core substrate 10") is prepared. This core substrate 10 will become the backbone of the component-embedded substrate. For this, copper or other metal, resin, ceramics, etc., can be used, for example, but copper or other metal is preferable because electrical shielding effect can be achieved. The thickness of the core substrate 10 is such that the tallest types of electronic components to be embedded in substrate explained later, or specifically semiconductor integrated circuits, inductor elements, resistive elements, capacitive elements, etc., can be buried sufficiently.

[Second Step]—FIG. 16(b)

Next, through holes 11 to 14 are made in specified parts of the core substrate 10. These through holes 11 to 14 are used to bury electronic components to be embedded in substrate explained later, or as connection paths to electrically connect the front side and back side of the substrate. Here, the three through holes from the left as shown in the figure, or namely 11 to 13, are used for component-burying purposes, while the one through hole 14 at the far right is used as a connection path; however, these allocations are only for the sake of convenience of illustration.

[Third Step]—FIG. 16(c)

Next, a resin sheet 15a is attached on one side (bottom side in the figure) of the core substrate 10. This resin sheet 15a is "peelable" after sealing of resin, and able to also "loosely secure" the electronic components to be embedded in substrate explained later, and although its material is not limited in any way, if resin or other soft material is used for the resin sheet 15a, for example, a copper foil or other reinforcement sheet can be attached and the resulting resin/copper foil laminate sheet may be used.

In the first example mentioned earlier, a component-securing resin 16 was applied in this step at the bottoms of the through holes 11, 12, 13, but such component-securing resin 16 is not used in the third example. "Loose securing" of the electronic components to be embedded in substrate is different from the first example in that it is implemented by utilizing the tack strength of the resin sheet 15a. In the first example, use of a component-securing resin 16 provides an advantage of increasing the selectable resin sheets 15a (because tackiness is not required), while the third example is advantageous in that application of a component-securing resin 16 is no longer necessary and consequently the manufacturing cost can be reduced.

Whether to adopt the first example or third example depends on the availability of the tacky resin sheet 15a. To be specific, adopting the third example is desirable if the tacky resin sheet 15a is available at low cost. This is because application of a component-securing resin 16 can be eliminated to reduce the manufacturing cost.

[Fourth Step]—FIG. 16(d)

Next, required electronic components to be embedded in substrate, or specifically an inductor element 17, a resistive element 18, and a semiconductor integrated circuit 19 in this case, are inserted into the corresponding through holes 11, 12, 13, respectively, and then pressed lightly against the resin sheet 15a in the holes to loosely secure the components using the tack strength of the resin sheet 15a.

Among the illustrated electronic components to be embedded in substrate, the "inductor element 17" has a structure specific to this embodiment (structure that allows for thickness reduction), and corresponds to one of the electronic components to be embedded in substrate 100, 100a, 100b, 200, 300, 400 explained earlier. Of the remaining electronic components to be embedded in substrate, the resistive element 18 can be replaced with a capacitive element and read as such, for example.

[Fifth Step]—FIG. 16(e)

Next, the electronic components to be embedded in substrate, such as the inductor element 17, resistive element 18, and semiconductor integrated circuit 19, are sealed. This sealing is implemented by preparing a sheet-shaped sealing resin 20 which is thick enough to be able to fill the internal volumes of the through holes 11 to 14, or specifically the volumes excluding the solid volumes of the electronic components to be embedded in substrate, pressing it with a specified force from above the top side of the substrate to cause the resin to flow in a manner fully filling the gaps around the electronic components to be embedded in substrate, and then applying specified heat, such as heat of approx. 160 to 200° C., to cure the sealing resin 20. For this sealing resin 20, it is also possible to attach a copper foil or other reinforcement sheet and use the resulting resin/copper foil laminate sheet. The functions required of the sealing resin 20 are low linear expansion and insulation property. In other words, any material can be used as long as it has sufficient flowability to fill the space without leaving gaps and also offers sufficient characteristics such as insulation property as an insulation substrate.

Furthermore, fully filling the gaps around the electronic component to be embedded in substrate in this step is the same as in the first example and second example and thus not explained.

[Sixth Step]—FIG. 16(f)

Next, the resin sheet 15a is peeled. This peeling can be done by means of heat, light or melting, for example.

[Seventh Step]—FIG. 16(g)

Next, resins 21, 22 are attached to the front side and back side of the substrate and then cured by means of heating, for example, to form a buildup layer on each side. For these resins 21, 22, too, copper foil or other reinforcement sheets 23, 24 may be attached and the resulting resin/copper foil laminate sheets may be used. Alternatively, PET film or other resin film may be attached instead of copper foil. In any event, these reinforcement sheets made of copper foil, PET, etc. 23, 24 are not a requirement.

[Eighth Step]—FIG. 17(a)

Next, the reinforcement sheets 23, 24 of the buildup layers are removed and via holes 25 to 33 and through hole 34 are formed at key locations. Here, the via holes 25, 26 are formed at positions corresponding to electrodes 35, 36 of the inductor element 17, the via holes 27, 28 are formed at positions corresponding to electrodes 37, 38 of the resistive element 18, and the via holes 29 to 33 are formed at positions corresponding to electrodes 39 to 43 of the semiconductor integrated circuit 19.

These via holes 25 to 33 and through hole 34 can be formed using a laser, but they can also be formed by photolithography if light-curing resin is used for the resins 21, 22 of the buildup layers. As for the through hole 34, it can be formed by mechanical means such as a drill or router.

The sizes of via holes are the same as in the first example and thus not explained.

[Ninth Step]—FIG. 17(b)

Next, the resins 21, 22 of the buildup layers are covered with resists 44, 45 and the resists 44, 45 are exposed and developed into specified pattern shapes.

[Tenth Step]—FIG. 17(c)

Next, the via holes 25 to 33 are filled with conductive materials 46 to 54, while conductive material 55 is formed on the interior wall of the through hole 34, after which wirings 56, 57 are formed on the surface of the buildup layers and then the resists 44, 45 are removed. The conductive materials 46 to 54 may be plating, or conductive resin, etc., may be used.

[Eleventh Step]—FIG. 17(d)

Next, second buildup layers are formed. These second buildup layers can also be formed using the same method employed in the seventh step mentioned earlier. To be specific, resins 58, 59 are attached on top of the first buildup layers and then cured to form the second buildup layers. For these resins 58, 59, too, copper foil or other reinforcement sheets 60, 61 can be attached and the resulting resin/copper film laminate sheets may be used, for example. Alternately, PET film or other resin film may be attached instead of copper foil.

[Twelfth Step]—FIG. 18(a)

Next, the reinforcement sheets 60, 61 of the second buildup layers are removed and via holes 62 to 70 are formed at specified positions of the resins 58, 59. These via holes 62 to 70 can also be formed using a laser.

[Thirteenth Step]—FIG. 18(b)

Next, the resins 58, 59 of the second buildup layers are covered with resists 71, 72 and the resists 71, 72 are exposed and developed into specified pattern shapes.

[Fourteenth Step]—FIG. 18(c)

Next, the via holes 62 to 70 in the second buildup layers are filled with conductive materials 73 to 81, after which wirings 82, 83 are formed on the surface of the second buildup layers and then the resists 71, 72 are removed. The conductive materials 73 to 81 may be plating, or conductive resin, etc., may be used.

[Fifteenth Step]—FIG. 18(d)

Lastly, the front side and back side of the substrate are covered with solder resists (also called "green resists") 84, 85 to form protective films to complete a component-embedded substrate 86a.

While two buildup layers are formed per side in the above steps, only one layer, or three or more layers may be formed.

This third example offers an advantage of eliminating the application of a component-securing resin 16 and thereby reducing the manufacturing cost.

The electrodes are led out from the "bottom side" or "top side" of the inductor element and other electronic components in the case of the above component-embedded substrate 86 (first example), component-embedded substrate 574 (second example), and component-embedded substrate 86a (third example), but the present invention is not limited to the foregoing. The electrodes can be led out from both the "top side and bottom side."

Figure 19:
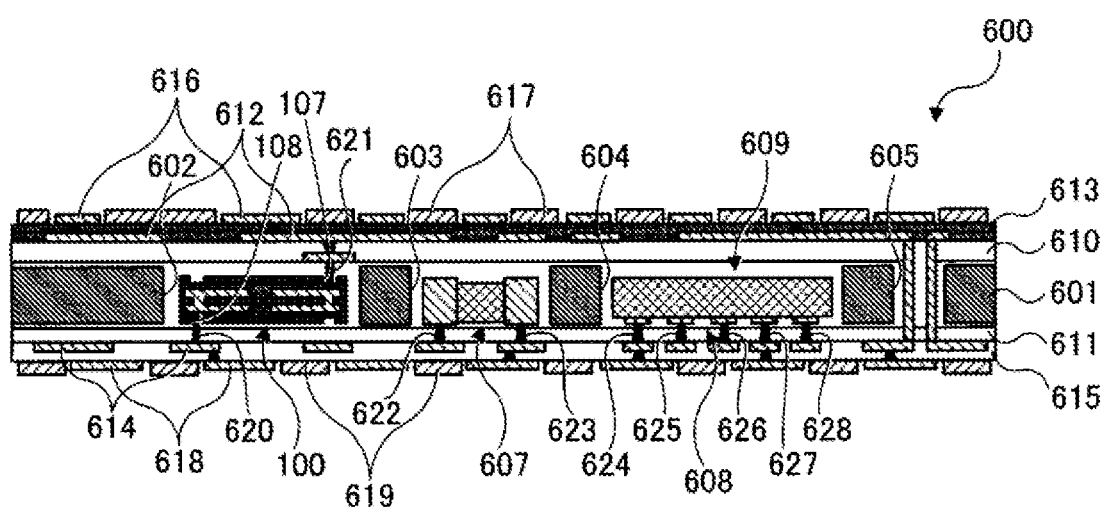
FIG. 19 illustrates a section view showing an overview of a component-embedded substrate 600 designed to lead out electrodes from both its "top side and bottom side."

FIG. 19 is a structural diagram showing a component-embedded substrate 600 designed to lead out electrodes from both its "top side and bottom side." In this figure, the component-embedded substrate 600 comprises: a core substrate 601; through holes 602 to 605 opened in the core substrate 601; electronic components such as an inductor element 100, a resistive element 607, and a semiconductor integrated circuit 608 inserted in the three through holes 602 to 604 on the left side; an insulation resin layer 609 that seals these electronic components; a first insulation resin layer 610 and a second insulation resin layer 611 attached on both faces of the insulation resin layer 609; a third insulation resin layer 613 stacked on the first insulation resin layer 610 via a wiring layer 612; a fourth insulation resin layer 615 stacked on the second insulation resin layer 611 via a wiring layer 614; a wiring layer 616 and a protective green resist 617 formed on the surface of the third insulation resin layer 613; a wiring layer 618 and a protective green resist 619 formed on the surface of the fourth insulation resin layer 615; and conductive materials 620 to 628 filled in via holes opened at positions corresponding to the electronic components.

The difference from the component-embedded substrate 86 in the first example, component-embedded substrate 574 in the second example, and component-embedded substrate 86a in the third example is that one of the electronic components embedded in the substrate, or specifically the inductor element 10 shown in FIG. 1, has electrodes that can be taken out from both the top side and bottom side of the inductor element. In other words, as shown in FIG. 1, this inductor element 100 has three insulation resin layers, namely a middle insulation resin layer 103, a top insulation resin layer 104, and a bottom insulation resin layer 105 sandwiched between a pair of magnetic layers 101, 102, with planar coils formed on the top and bottom insulation resin layers 104, 105, where the constitution is such that circular holes 106, 107 for taking out the electrodes are provided in the top magnetic layer 101, while similar circular holes 108, 109 for taking out the electrodes are provided in the bottom magnetic layer 102. Accordingly, the electrodes can be taken out from both the top side and bottom side of the substrate by leading out the electrodes through one hole (hole 107 in the figure) on the top side and one hole (hole 108 in the figure) on the bottom side, as shown in FIG. 19.

BRIEF DESCRIPTION OF THE SYMBOLS 46 to 55 Conductive material
73 to 81 Conductive material
86 Component-embedded substrate
86a Component-embedded substrate
100 Electronic component to be embedded in substrate
100a Electronic component to be embedded in substrate
100b Electronic component to be embedded in substrate
101, 102 Magnetic layer
101a, 102a Magnetic layer
101b, 102b Magnetic layer
103 Middle insulation resin layer (insulator)
104 Top insulation resin layer (insulator)
105 Bottom insulation resin layer (insulator)
106 to 109 Hole
110, 111 Planar coil
112, 113 Terminal electrode
115, 116 Terminal electrode
121, 122 Absent part
123 to 126 Absent part
200 Electronic component to be embedded in substrate
201, 202 Magnetic layer
206, 207 Planar coil
208 to 212 Terminal electrode
300 Electronic component to be embedded in substrate
301, 302 Magnetic layer
306, 307 Planar coil
308 to 312 Terminal electrode
313 to 317 Hole
400 Electronic component to be embedded in substrate
401, 402 Magnetic layer
406, 407 Planar coil
408, 409 Terminal electrode
410 Hole
534 to 543 Conductive material
561 to 569 Conductive material
574 Component-embedded substrate
620 to 628 Conductive material

What is claimed is:

1. An electronic component to be embedded in a substrate, comprising:
   a pair of magnetic layers;
   a planar coil placed between the pair of magnetic layers;
   multiple insulator layers placed between the pair of magnetic layers in a manner sandwiching both sides of the planar coil;
   a terminal electrode provided at least on one end of the planar coil; and
   a hole, opening, or absent part provided in the magnetic layer at a location corresponding to the position of the terminal electrode provided at least on one end of the planar coil,
   wherein the planar coil comprises a first planar coil and a second planar coil where the first planar coil and the second planar coil are connected to each other in series, and the terminal electrode provided at least on one end of the first planar coil and the terminal electrode provided at least on one end of the second planar coil are each placed at positions corresponding to different corners on one side of the insulator layer which has a rectangular shape, wherein, for the terminal electrode provided at least on one end of the first planar coil and the terminal electrode provided at least on one end of the second planar coil, a terminal electrode not connected to either planar coil is provided, respectively, in a different corner corresponding to one side of the insulator layer, and wherein the terminal electrode provided at least on one end of the first planar coil is connected to the non-connected terminal electrode provided on the second planar coil side via a front-back through electrode provided in the insulator layer, while the terminal electrode provided at least on one end of the second planar coil is connected to the non-connected terminal electrode provided on the first planar coil side via a front-back through electrode provided in the insulator layer.

2. An electronic component to be embedded in a substrate according to claim 1, wherein the magnetic layer has a rectangular plane, and the terminal electrode provided at least on one end of the planar coil is formed at a position corresponding to a corner of the magnetic layer.

3. An electronic component to be embedded in a substrate according to claim 1, wherein the terminal electrode is formed on both ends of the planar coil and also at one or more desired positions between both ends of the planar coil.

4. An electronic component to be embedded in substrate according to claim 1, wherein the hole, opening, or absent part in the magnetic layer has an opening area roughly equivalent to or smaller than the size of the terminal electrode on the planar coil.

5. An electronic component to be embedded in a substrate according to claim 1, wherein a hole or opening is provided at a corresponding position in the insulator layer so that the terminal electrode can be led out through the hole, opening, or absent part.

6. An electronic component to be embedded in a substrate according to claim 1, wherein, of the terminal electrodes, one terminal electrode is placed at a position corresponding to a corner of the insulator layer, while the other terminal electrode is placed at a position corresponding to the center side of the insulator layer.

7. An electronic component to be embedded in a substrate according to claim 6, wherein the series connection of the first planar coil and second planar coil is made by connecting the terminal electrodes placed at positions corresponding to the center sides of the first planar coil and second planar coil via a front-back through electrode provided in the insulator layer between them.

8. An electronic component to be embedded in a substrate according to claim 6, wherein the terminal electrode provided at least on one end of the first planar coil and the terminal electrode provided at least on one end of the second planar coil are placed in corners on one side of the insulator layer corresponding to left and right positions on different planes.

9. A component-embedded substrate comprising the electronic component of claim 1 embedded in a substrate, wherein a hole or opening is formed in the insulator layer via the hole, opening, or absent part in the electronic component, which hole or opening a conductive material is formed, and the terminal electrode provided at least on one end of the first planar coil of the electronic component is electrically connected to an electrode provided on the substrate side via the conductive material.

* * * * *